United States Patent [19]
Tsukude

[11] Patent Number: 5,088,064
[45] Date of Patent: * Feb. 11, 1992

[54] DYNAMIC SEMICONDUCTOR MEMORY DEVICE OF A TWISTED BIT LINE SYSTEM HAVING IMPROVED RELIABILITY OF READOUT

[75] Inventor: Masaki Tsukude, Hyogo, Japan

[73] Assignee: Mitsubishi Denki Kabushiki Kaisha, Tokyo, Japan

[*] Notice: The portion of the term of this patent subsequent to Dec. 11, 2007 has been disclaimed.

[21] Appl. No.: 603,961

[22] Filed: Oct. 24, 1990

Related U.S. Application Data

[63] Continuation of Ser. No. 400,898, Aug. 30, 1989, Pat. No. 4,977,542.

[30] Foreign Application Priority Data

Aug. 30, 1988 [JP] Japan .................. 63-217108

[51] Int. Cl.$^5$ ............................... G11C 11/40
[52] U.S. Cl. .................... 365/207; 365/149; 365/210; 365/203
[58] Field of Search ............ 365/189.01, 189.05, 365/203, 207, 210, 63, 230.06

[56] References Cited

U.S. PATENT DOCUMENTS 3,942,164 3/1976 Dunn ............... 365/189.01

FOREIGN PATENT DOCUMENTS 60-254489 12/1985 Japan.

Primary Examiner—Terrell W. Fears
Attorney, Agent, or Firm—Lowe, Price, LeBlanc & Becker

[57] ABSTRACT

An arrangement for providing a compensation of capacitance coupling between word lines and bit lines in a memory structure including twisted bit lines. Two dummy word lines maintained at a predetermined potential are formed at a twisted portion of a pair of bit lines. Dummy cells are provided at respective twisted portions of the dummy word lines and the bit lines. A plurality of word lines are formed in a direction intersection with the bit lines and the word lines are divided into four word line groups according to positions of the twisted portions of the bit line pairs. When an arbitrary word line is selected, a potential of at last one dummy word line corresponding to the word line group to which the selected word line belongs is lowered. Consequently, the rise of the potential of the bit lines caused by the selection of the word line is compensated for by the lowering of the potential of at least one dummy word line, making it possible to decrease errors in reading. Particular cell layer arrangements simplify increase in integration density in the combination of dummy cell compensation with the twisted bit line balancing of capacitance coupling.

12 Claims, 24 Drawing Sheets

NB --- CONTACT WITH BIT LINE

FIG.18 PRIOR ART
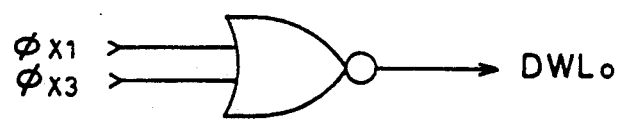
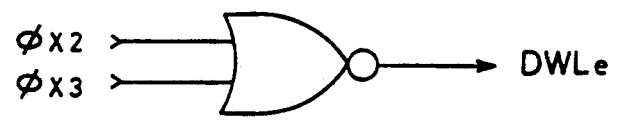

DYNAMIC SEMICONDUCTOR MEMORY DEVICE OF A TWISTED BIT LINE SYSTEM HAVING IMPROVED RELIABILITY OF READOUT

This application is a continuation of application Ser. No. 07/400,898 filed Aug. 30, 1989, now U.S. Pat. No. 4,977,542.

CROSS-REFERENCE TO RELATED, COPENDING APPLICATIONS

U.S. application Ser. No. 236,361, entitled "Dynamic Semiconductor Memory Device", filed Aug. 25, 1988.

U.S. application Ser. No. 276,741, entitled "Bit Line Structure for Dynamic Type Semiconductor Memory Device", filed Nov. 28, 1988.

BACKGROUND OF THE INVENTION

1. Field of the Invention

This invention relates generally to dynamic semiconductor memory devices, and more particularly, it relates to an improvement in correction of reading errors in a memory cell array structure of a twisted bit line system.

2. Description of the Background Art

FIG. 13 is a block diagram showing a structure of a conventional semiconductor memory device. FIG. 13 shows an example of a 64 k bit memory device having eight inputs A0 to A7 as address inputs.

Referring to FIG. 13, the memory cell array 1 comprises a plurality of memory cells arranged in a plurality of rows and columns. A plurality of word lines are provided corresponding to the plural rows of the memory cell array 1 and a plurality of bit lines are provided corresponding to the plural columns of the same.

An RAS buffer 4 activates a row address buffer 5, a $\phi p$ generation circuit 6, a $\phi x$ generation circuit 7 and a sense amplifier control circuit 8 in response to an externally applied row address strobe signal $\overline{RAS}$. The $\phi p$ generation circuit 6 and the $\phi x$ generation circuit 7 generate a precharge signal $\phi p$ and a driving signal $\phi x$ at prescribed timings, respectively. The row address buffer 5 latches externally applied address signals A0 to A7 and applies a part of the signals as row address signals RA2 to RA7 to the row predecoder 9 and applies the remainder signals as row address signals RA0 to RA1 to the $\phi x$ subdecoder 10. The row predecoder 9 predecodes row address signals RA2 to RA7 applied from the row address buffer 5 and applies row selection signals Xi, Xj and Xk to the row decoder group 11. The row decoder group 11 selects four rows in the memory cell array 1 based on the row selection signals Xi, Xj and Xk. The $\phi x$ subdecoder 10 applies subdecode signals $\phi x1$ to $\phi x4$ to the word driver group 13 and the dummy word signal generation circuit 12 based on the row address signals RA0 to RA1 applied from the row address buffer 5, in response to the driving signal $\phi x$ from the $\phi x$ generation circuit 7.

The word driver group 13 drives word lines for one row out of the four rows selected by the row decoder group 11 in response to the subdecode signals $\phi x1$ to $\phi x4$. Information in the memory cells connected to the driven word lines is read out on each bit line. On this occasion, either a dummy word line DWLo or a dummy word line DWLe is driven to fall by the dummy word line signal generation circuit 12 dependent on the bit line BL or $\overline{BL}$ to which the memory cells selected by the driven word lines are connected. The sense amplifier control circuit 8 operates the sense amplifier group 14 at a prescribed timing. The sense amplifier group 14 amplifies the information on each bit line.

Meanwhile, the CAS buffer 15 activates a column address buffer 16 and a read/write buffer 17 in response to an externally applied column address strobe signal $\overline{CAS}$. The column address buffer 16 latches externally applied address signals A0 to A7 and applies the same to the column predecoder 18 as the column address signals. The column predecoder 18 predecodes the column address signals and applies column selection signals to the column decoder group 19. The column decoder group 19 selects one column in the memory cell array 1 based on the column selection signal. In this manner, one word line and one bit line are selected and reading or writing of information is carried out for the memory cell at the intersection. In FIG. 13, only the selected one word line WL, and, the selected one bit line BL and a memory cell MC at the intersection thereof are shown.

Reading or writing of information is selected by the read/write buffer 17. The read/write buffer 17 activates an input buffer 21 or an output buffer 22 in response to an externally applied read/write signal R/W. When the input buffer 21 is activated, the input data $D_{in}$ is written in the memory cell MC which is selected as described above. When the output buffer 22 is activated, the information stored in the memory cell MC which is selected as described above is read as the output data $D_{out}$. Each of the above described circuits is formed on the same semiconductor chip 23.

FIG. 14 shows a structure of one portion of the row predecoder 9 shown in FIG. 13, illustrating the circuit portion for generating the row selection signal Xi, which is any one of the signals X1, X2, X3 and X4.

A gate circuit 91 receives the row address signal RA2 and outputs the same signal RA2 and the inverted signal $\overline{RA2}$ thereof. A gate circuit 92 receives the row address signal RA3 and outputs the same signal RA3 and the inverted signal $\overline{RA3}$ thereof. Either the signal RA2 or $\overline{RA2}$ and either the signal RA3 or $\overline{RA3}$ are inputted to the gate circuits 93, 94, 95 and 96. The combinations of the signals RA2 or $\overline{RA2}$ and RA3 or $\overline{RA3}$ inputted to the gate circuits 93 to 96 are different from each other. Row selection signals X1 to X4 are outputted from the gate circuits 93 to 96, respectively. One of the row selection signals X1 to X4 rises to high (H) level and the other signals remain low (L) level in response to the levels of the row address signals RA2 and RA3.

The row selection signal Xj in FIG. 13 means one of the signals X5, X6, X7 and X8, while Xk means one of the signals X9, X10, X11 and X12. The row selection signals X5 to X8 are generated in the same manner as in FIG. 14 by the row address signals RA4 and RA5, while the row selection signals X9 to X12 are generated in the same manner as in FIG. 14 by the row address signals RA6 and RA7.

FIG. 15 shows the structure of $\phi x$ subdecoder 10 in FIG. 13. The $\phi x1$ generation circuit 101, $\phi x2$ generation circuit 102, $\phi x3$ generation circuit 103 and $\phi x4$ generation circuit 104 respectively receive the row address signal RA0 or the inversion signal $\overline{RA0}$ thereof and the row address signal RA1 or the inversion signal $\overline{RA1}$ thereof, and output subdecode signals $\phi x1$, $\phi x2$, $\phi x3$ and $\phi x4$, respectively, in response to the driving signal $\phi x$. One of the subdecode signals $\phi x1$, $\phi x2$, $\phi x3$ and $\phi x4$ rises to H level and the other remain L level in response to the levels of the row address signals RA0, RA1 and of the inversion signals $\overline{RA0}$, $\overline{RA1}$ thereof.

FIG. 16 shows a detailed structure of the memory cell array 1 and the peripheral portion thereof in FIG. 13.

The memory cell array 1 includes 4 m word lines WL and a plurality of bit line pairs BL and $\overline{BL}$ which are arranged intersecting with each other in the array 1, where m is a positive integer. Two dummy word lines of DWLo and DWLe are arranged on a side of those word lines WL (WL1 to WL4). A memory cell MC is provided at an intersection of each word line WL and the bit line BL or $\overline{BL}$, while dummy cells DCo and DCe are provided at intersections of the dummy word line DWLo and the bit line BL, and DWL and $\overline{BL}$, respectively. 4 m word drivers 13a are provided corresponding to the 4 m word lines WL (WL1 to WL4). The word lines WL (WL1 to WL4) are connected to the corresponding word drivers 13a. 4 m word lines WL and 4 m word drivers 13a are divided into m sets, each comprising four word lines WL and four word drivers 13a. m row decoders 11a are provided corresponding to the m sets. Each row decoder 11a selects four word drivers 13a of the corresponding set.

A plurality of sense amplifiers 14a and a plurality of column decoders 19a are provided corresponding to the plurality of bit line pairs BL and $\overline{BL}$. Each bit line pair BL and $\overline{BL}$ is connected to the corresponding sense amplifier 14a and the corresponding column decoder 19a.

Now, the operation of the circuit shown in FIG. 16 will be described.

One of the row decoders 11a is selected based on the row selection signals Xi, Xj and Xk. The selected row decoder 11a activates four word drivers 13a of the corresponding set. One of the four word drivers 13a activates the corresponding word line WL in response to the subdecode signals $\phi x1$ to $\phi x4$. Consequently, the information in the memory cell MC connected to the word line WL is read onto each bit line BL or $\overline{BL}$ and is amplified by the sense amplifier 14a. On this occasion, if the selected memory cell is connected to the bit line BL, the dummy word line DWLo falls. Then, one of the column decoders 19a is selected in response to the column address signal. In writing, the information is written onto the bit line pair BL and $\overline{BL}$ connected to the selected column decoder 19a. In reading, the information on the bit line pair BL and $\overline{BL}$ connected to the selected column decoder 19a is read.

FIG. 17 shows a particular circuit structure of the row decoder 11a and the word driver 13a shown in FIG. 15.

The row decoder 11a comprises N channel MOS transistors Q1 to Q4, and P channel MOS transistors Q5 to Q7. The transistors Q5 and Q6 are coupled between the supply potential Vcc and a node N1. A precharge signal $\phi p$ is applied to the gate of the transistor Q5 and the gate of the transistor Q6 is connected to a node N2. The transistors Q1, Q2 and Q3 are coupled in series between the node N1 and the ground potential. Row selection signals Xi, Xj and Xk are applied to the gates of the transistors Q1, Q2 and Q3, respectively. As described above, Xi denotes one of X1 to X4, Xj denotes one of X5 to X8, and Xk denotes one of X9 to X12. The combination of the row selection signals Xi, Xj and Xk applied to each row decoder 11a differs from that of other row decoders 11a. The transistor Q7 is coupled between the supply potential Vcc and the node N2, and its gate is connected to the node N1. The transistor Q4 is coupled between the node N2 and the ground potential, and its gate is connected to the node N1. The transistors Q4 and Q7 constitute an inverter. Therefore, the level of the node N2 and the level of the node N1 are opposite to each other.

The nodes N1 and N2 of each row decoder 11a are connected to the four word driver 13a of the corresponding set. Each word driver 13a comprises N channel MOS transistors Q8, Q9 and Q10. The transistor Q9 is coupled between one of the subdecode signals $\phi x1$ to $\phi x4$ and a word line WL, and its gate is connected to $\phi x4$ and a word line WL, and its gate is connected to the node N2 of the corresponding row decoder 11a through the transistor Q8. The transistor Q10 is coupled between the word line WL and the ground potential, and its gate is connected to the node N1 of the corresponding row decoder 11a. The gate of the transistor Q8 is coupled to the supply potential Vcc. The word driver 13a in each set are coupled to respective different ones of the subdecode signals $\phi x1$, $\phi x2$, $\phi x3$ and $\phi x4$.

Next, the operation of the row decoder 11a and the word driver 13a will be described. When the precharge signal $\phi p$ is at L level, the transistor Q5 is in the on state and the potential of the node N1 is at H level (Vcc level). Therefore, the transistor Q10 of the word driver 13a is in the on state and the potential of the word line WL is at L level (ground level). When the precharge signal $\phi p$ rises to H level, the transistor Q5 turns off. When the row selection signals Xi, Xj and Xk applied to the gates of the transistors Q1, Q2 and Q3 all rise to H level, the transistors Q1, Q2 and Q3 all turn on, so that the potential of the node N1 falls to L level and the potential of the node N2 rises to H level. Consequently, the transistor Q10 of the word driver 13a turns off. When one of the subdecode signals $\phi x1$ to $\phi x4$ rises to H level, the potential of the corresponding one of the word line WL1 to WL4 rises to H level.

The level of the dummy word line DWLo falls at the rise of either the word line WL1 or WL3 and the level of the dummy word line DWLe falls at the rise of either of the word line WL2 or WL4 under the control of the dummy word signal generating circuit 12. A circuit for realizing such operation is shown in FIG. 18. Referring to FIG. 18, the dummy word line DWLo is provided as the output of the two-input NOR of the subdecode signals $\phi x1$ and $\phi x3$, and the dummy word line DWLe is provided as the output of the two-input NOR of the subdecode signals $\phi x2$ and $\phi x4$.

FIG. 19 shows a detailed structure of the memory cell array and the sense amplifier shown in FIG. 13.

Referring to FIG. 19, word lines WL1, WL2 and dummy word lines DWLo, DWLe are arranged in the direction intersecting with the bit lines BL and $\overline{BL}$. A memory cell selection transistor QM and a capacitor C are connected in series as a memory cell at an intersection of the word line WL1 and the bit line BL. Similarly, a memory cell is connected at an intersection of the word line WL2 and the bit line $\overline{BL}$. A dummy cell selection transistor QD and a dummy capacitor DC0 are connected in series as a dummy cell at an intersection of the dummy word line DWLo and the bit line BL. Similarly, a dummy cell is connected at an intersection of the dummy word line DWLe and the bit line $\overline{BL}$. Respective one ends of the bit lines BL and $\overline{BL}$ are connected to a precharge potential $V_{PRC}$ through precharge transistors QP and QP'. The precharge potential $V_{PRC}$ is maintained at a potential Vcc/2. The bit lines BL and $\overline{BL}$ are connected to each other through a transistor QE. A precharge signal $\phi_{PRC}$ is applied to the respective gates of the transistors QP, QP' and QE. The bit lines BL and $\overline{BL}$ are connected with a sense amplifier SA for detecting and amplifying a potential difference appearing on the bit lines. The ground potential is applied to the sense amplifier SA through the transistor Q1 and the supply potential Vcc is applied thereto through the transistor Q2. A sense amplifier activation signal $\phi s$ is applied to the gate of the transistor Q1. A sense amplifier activation signal $\overline{\phi s}$ is applied to the gate of the transistor Q2. The respective other ends of the bit lines BL and $\overline{BL}$ are connected to an input/output line I/O through a transistor QT and to an input/output line $\overline{I/O}$ through a transistor QT'. An output signal from a column decoder is applied to the gates of the transistors QT and QT'.

In the following, the operation of the semiconductor memory device shown in FIGS. 13 to 19 will be described with reference to the timing chart of FIG. 20.

In a standby period of the precharge signal $\phi p$ at L level, the potential of the node N1 of each row decoder 11a in FIG. 17 is at H level and those of the node N2 thereof is at L level. Consequently, the potentials of all the word lines WL are at L level. The dummy word lines DWLo and WLe are both at H level in response to the subdecode signals $\phi x1$ to $\phi x4$ all at L level. After the precharge signal $\phi p$ rises to H level, the signals Xi, Xj and Xk applied to the selected row decoder 11a are all raised to H level. As a result, the potential of the node N1 falls to L level and the potential of the node N2 rises to H level. Thus, the corresponding four word drivers 13a are selected. Then, when one of the subdecode signals $\phi x1$ to $\phi x4$ rises to H level, the potential of the corresponding word line WL is raised to H level by the word driver 13a. At the same time, either the dummy word line DWLo or DWLe falls by the logic shown in FIG. 18.

On the other hand, the precharge signal $\phi_{PRC}$ falls to L level before the potential of the corresponding word line rises, and the bit line is in the floating state. For example, if the word line WL1 is selected, the potential of the word line WL1 rises to H level and the dummy word line DWLo is selected at the same time and falls to L level. Accordingly, the memory cell selection transistor QM is turned on and the memory cell MC is connected to the bit lines. For example, if the potential of H level is stored in the memory cell MC connected to the bit line BL, the potential of the bit line rises by a value determined by its stray capacitance $C_{BL}$ and the capacitance Cs of the memory cell MC. Meanwhile, the potential of the bit line $\overline{BL}$ is maintained at Vcc/2 and it serves as a reference potential for the potential of the bit line BL. Subsequently, when the sense amplifier activation signal $\phi s$ rise to H level and the sense amplifier activation signal $\overline{\phi s}$ falls to L level to activate the sense amplifier SA, the potential of the bit line BL becomes Vcc and the potential of the bit line $\overline{BL}$ becomes the ground potential, whereby the sense operation is completed.

In the above described sequential operation, the potential of the bit line BL rises due to a capacitance coupling through a stray capacitance Cp existing between the connection portion of the bit line BL of the memory cell selection transistor QM shown in FIG. 21 and the word line WL1 at the rise of the word line WL1, thereby affecting a permissible operation range of a read signal. Particularly, if the potential of L level is stored in the memory cell MC, the potential of the bit line BL rises due to the capacitance coupling to a higher level than the initially expected level which should be lower than the potential of the bit line $\overline{BL}$, causing L level information to be read as H level information. A dummy cell DC is provided to offset such potential change of the bit line BL. By lowering the potential of the dummy word line DWLo, it is possible to apply, to the bit line BL, a potential change of an equal amount opposite to that caused in the bit line BL at the rise of the word line WL1. More specifically, influence on the operation of reading the potential change is to be offset by applying the potential change of the equal amount in the opposite direction to the bit line BL.

However, due to noises between the adjacent bit line pairs, caused by the capacitance between the bit lines, the amplitude of the voltage for reading is lowered and the above described method is still unsatisfactory as the measures for preventing errors in reading of data. This will be explained in more detail in the following.

Referring to FIG. 22, it is assumed that each bit line has a capacitance C1 with respect to the ground potential (fixed potential) through the corresponding cell plate or substrate, a capacitance C2 with respect to the bit line to be paired, and a capacitance C3 with respect to the bit line of the adjacent bit line pair. The length of each bit line is l and the memory cell capacity is Cs.

It is also assumed that each memory cell stores charge of H level: Cs Vcc (for writing of Vcc) and charge of L level: 0 (for writing of 0V).

If the precharge level of each bit line is Vcc/2, a memory cell connected to a bit line BL1 for example is selected and if a dummy cell is connected to the bit line $\overline{BL1}$, the potentials $V_{BL1}$ and $V_{\overline{BL1}}$ of the bit lines BL1 and $\overline{BL1}$ are as follows:

$$V_{BL1} = \frac{Vcc}{2} - \frac{1/2 Cs \cdot Vcc}{C1 + C2 + C3} + \quad (1)$$

$$\frac{C3}{C1 + C2 + C3} \Delta V_{BL0} + \frac{C2}{C1 + C2 + C3} \Delta V_{\overline{BL1}}$$

(reading of L level)

$$= \frac{Vcc}{2} + \frac{1/2 Cs \cdot Vcc}{C1 + C2 + C3} + \quad (2)$$

$$\frac{C3}{C1 + C2 + C3} \Delta V_{BL0} + \frac{C2}{C1 + C2 + C3} \Delta V_{\overline{BL1}}$$

(reading of H level)

$$V_{\overline{BL1}} = \frac{Vcc}{2} + \frac{C2}{C1 + C2 + C3} \Delta V_{BL1} + \quad (3)$$

$$\frac{C3}{C1 + C2 + C3} \Delta V_{BL2}$$

where $\Delta V_{\overline{BL0}}$, $\Delta V_{\overline{BL1}}$, $\Delta V_{BL1}$, and $\Delta V_{BL2}$ are potential changes in the bit lines indicated by the letters, respectively.

From the above indicated equations (1) to (3), considering that the bit lines BL1 and $\overline{BL1}$ have the equal precharge level, the voltage difference between the bit line pairs is obtained in the following manner, by calculations of (1)–(3) and (2)–(3).

$$V_{BL1} - V_{\overline{BL1}} = \Delta V_{BL1} - \Delta V_{\overline{BL1}} \quad (4)$$

$$= \pm \frac{1}{1 + \alpha} \cdot \frac{\beta}{2} +$$

$$\frac{\gamma}{1 + \alpha} \cdot (\Delta V_{BL0} - \Delta V_{BL2})$$

-continued $$\text{where} \quad \alpha = \frac{C2}{C1 + C2 + C3},$$

$$\beta = \frac{Cs \cdot Vcc}{C1 + C2 + C3},$$

$$\gamma = \frac{C3}{C1 + C2 + C3},$$

"+", which is attached to the numerical formula "1/(1+α)·β/2", indicates reading of H level and "−", which is attached to the numerical formula "1/(1+α)·β/2", indicates reading of L level.

The first term of the right side of the equation (4) represents an inherent voltage difference for reading and the second term thereof represents a noise component through a coupling capacitance from the bit lines BL0 and BL2 of the adjacent bit line pairs.

If a bit line pitch is decreased as a result of enhancement of the integration scale of the memory, the capacitance C3 between the bit line pairs increases and the value of the second term of the equation (4) becomes large. Accordingly, the voltage for reading is adversely affected and the permissive range for reading is reduced, resulting in the deterioration of the soft error ratio and causing erroneous operation.

Under the circumstances, in order to solve the problems of the above described device, the inventors of the present invention proposed "Bit Line Structure for Semiconductor Memory Device" of U.S. application Ser. No. 131,633, which discloses a semiconductor memory device capable of completely suppressing lowering of the amplitude of the reading voltage due to the noise between the adjacent bit line pairs by the capacitance between the bit lines.

In the above mentioned semiconductor memory device, intersections are provided at one or more portions on the bit line pairs so that the capacitance coupling noise applied to the respective bit lines of the pair from the adjacent bit line pairs can be made completely equal, thereby preventing lowering of the voltage difference for reading.

In the following, the above described improved semiconductor memory device will be described with reference to FIG. 23.

In this improvement example, as shown, the bit line pairs (BL0, BL0, BL1, BL1 etc.) are divided in four equal sections and those bit lines are twisted at the equally divided points CP1, CP2 and CP3 in the following manner.

(1) The bit lines BL0 and BL0 are twisted at CP2.
(2) The bit lines BL1 and are twisted at CP1 and CP3.
(1)' The bit lines BL2 and BL2 are twisted at CP2.
(2)' The bit lines BL3 and BL3 are twisted at CP1 and CP3.

More specifically, the odd-numbered bit line pairs starting from the bit line pairs BL0 and BL0 are twisted at CP2 and the even-numbered bit line pairs are twisted at CP1 and CP3. In consequence, the capacitance coupling noise applied to the respective bit line pairs from the adjacent bit line pairs is expressed as below, as in the previously described conventional example.

(1) The capacitance coupling noises $\Delta V_{BL1}$, and $\Delta V_{\overline{BL1}}$, applied to the bit line pairs BL1 and $\overline{BL1}$ from the respective adjacent bit line pairs are as follows:

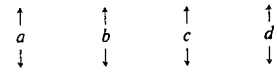

$$\Delta V_{BL1}' = \frac{1}{4} \cdot \frac{\gamma}{1+\alpha} (\Delta V_{BL0} + \Delta V_{BL2} + \Delta V_{BL2} + \Delta V_{BL0})$$

$$\begin{array}{cccc} \uparrow & \uparrow & \uparrow & \uparrow \\ a & b & c & d \\ \downarrow & \downarrow & \downarrow & \downarrow \end{array}$$

$$\Delta V_{\overline{BL1}}' = \frac{1}{4} \cdot \frac{\gamma}{1+\alpha} (\Delta V_{BL2} + \Delta V_{BL0} + \Delta V_{BL0} + \Delta V_{BL2})$$

where $\Delta V_{\overline{BL0}}$ is the component associated with section "a" of FIG. 23, $\Delta V_{BL2}$ is the component associated with section "b", etc. and accordingly the two noises are completely equal.

(2) The capacitance coupling noises $\Delta V_{\overline{BL2}}$, and $\Delta V_{\overline{BL2}}$, applied to the bit lines BL2 and $\overline{BL2}$ from the respective adjacent bit line pairs are as follows:

$$\Delta V_{BL2}' = \frac{1}{4} \cdot \frac{\gamma}{1+\alpha} (\Delta V_{BL1} + \Delta V_{BL1} + \Delta V_{BL3} + \Delta V_{BL3})$$

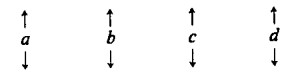

$$\Delta V_{\overline{BL2}}' = \frac{1}{4} \cdot \frac{\gamma}{1+\alpha} (\Delta V_{BL3} + \Delta V_{BL3} + \Delta V_{BL1} + \Delta V_{BL1})$$

thus, the two noises are completely equal.

Similarly the capacitance coupling noises applied to the respective bit lines of all the pairs from the adjacent bit line pairs are entirely equal.

(3) Also regarding the bit line pair BL0 and $\overline{BL0}$ at the end of the memory cell array, the capacitance coupling noises applied thereto are as indicated below:

$$\Delta V_{BL0}' = \frac{1}{4} \cdot \frac{\gamma}{1+\alpha} (\Delta V_{BL1} + \Delta V_{BL1})$$

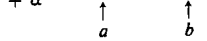

$$\Delta V_{\overline{BL0}}' = \frac{1}{4} \cdot \frac{\gamma}{1+\alpha} (\Delta V_{BL1} + \Delta V_{BL1})$$

$$\begin{array}{cc} \uparrow & \uparrow \\ a & b \end{array}$$

and thus the two noises are entirely equal.

Thus, in this improvement example, the capacitance coupling noises applied to the respective bit lines from the adjacent bit line pairs at the time of reading signals are entirely equal, which makes it possible to completely prevent reduction of the voltage difference in reading due to such noises and to enlarge the permissible range for reading and to improve the soft error ratio.

Next, the disadvantages of this improvement example will be described. Let us assume a case, in which a dummy cell system is applied to the bit line pairs which intersect at specified points as in the above indicated improvement example. FIG. 24 shows an arrangement estimated in the case of applying the conventional dummy cell system in FIG. 19. In FIG. 24, only the word lines WL1 and WL2 are shown typically for each block. The mark o at the intersection of each word line and each bit line indicates that a memory cell is provided. The mark at the intersection of a dummy word line and its bit line indicates that a dummy cell is provided.

As for the dummy cell, it is necessary to select the one connected to the same bit line as for the memory cell and in the case of FIG. 24, the selection is effected in the following manner.

(1) DWLo is selected if a word line, e.g., WL1 is selected from the block d, and DWLe is selected if the word line WL2 for example is selected.

(2) If the word lines WL1 and WL2 from the block c are selected, half of the total number of the bit line pairs are always found to be unacceptable (BL1, BL1, BL3, BL3 in FIG. 24) even if either DWLo or DWLe is selected.

Also for the blocks b and a, half of the total number of the bit line pairs are found to be unacceptable.

Therefore, the conventional dummy cell system cannot be applied to the cases including intersections of the bit line pairs.

FIG. 25 is a plan view showing intersection parts of the conventional bit lines and FIG. 26 is a sectional view taken along XXVI—XXVI in FIG. 25.

Referring to those figures, an isolation oxide film 58 defining an active region is formed on a main surface of a semiconductor substrate 55. Impurity regions 59a and 59b defining transistor and capacitor regions of a memory cell are formed in the active region. A cell plate defining a capacitor is formed through an insulating film over the impurity region 59b. An interlayer insulating film 60 is formed to cover the whole main surface of the semiconductor substrate 55. Word lines 51 for controlling conduction of the memory transistor of the memory cell are formed in the interlayer insulating film 60. Bit lines 52 are formed on the interlayer insulating film 60 in the direction perpendicular to the word lines 51. Each bit line 52 is connected to the corresponding impurity region 59a through a contact hole 53 formed in the interlayer insulating film 60. Each bit line 52 is formed of an aluminum connection or the like. In a bit line under a twisted portion of the bit line pair, the aluminum connection is connected through a contact 56 through a polysilicon connection layer 54. The twisted portions of the conventional bit lines are formed as described above and if the areas occupied by the intersection parts become large although such intersection parts are necessary, such large areas are disadvantageous in enhancement of the integration scale of the device.

SUMMARY OF THE INVENTION

An object of the present invention is to improve reliability in read operation in a dynamic semiconductor memory device of a twisted bit line system.

Another object of the present invention is to realize a dummy reversal system in a dynamic semiconductor memory device of a twisted bit line system.

Still another object of the present invention is to realize a dummy reversal system and to simplify selection logic of dummy word lines in a dynamic semiconductor memory device of a twisted bit line system.

A further object of the present invention is to accomplish a large integration scale of elements in a dynamic semiconductor memory device of a twisted bit line system.

A further object of the present invention is to reduce areas occupied by twisted portions of bit lines in a dynamic semiconductor memory device of a twisted bit line system.

A still further object of the present invention is to realize a dummy reversal system and to accomplish a large integration scale of elements in a dynamic semiconductor memory device of a twisted bit line system.

A still further object of the present invention is to realize a dummy reversal system and to reduce areas occupied by twisted portions of bit lines in a dynamic semiconductor memory device of a twisted bit line system.

In order to attain the above described objects, a semiconductor memory device according to the present invention generally includes: a plurality of memory cells, a plurality of bit line pairs, a plurality of word lines, reading means, a plurality of amplifiers, and potential applying means. The plurality of memory cells are arranged in a matrix including rows and columns and store information charge. Each of the bit line pairs includes a pair of bit lines having at least an intersection and the respective bit lines are provided corresponding to the rows of the memory cells and they are connected to the memory cells of the corresponding rows. The plurality of word lines are provided corresponding to the columns of memory cells in the direction intersecting with the bit line pairs and they are connected to the memory cells of the corresponding columns. The reading means selects any of the word lines by applying a potential thereto and reads information charge of the memory cells connected to the selected word line onto one of the respective bit lines of each bit line pair. The plurality of sense amplifiers are provided corresponding to the bit line pairs and detect a potential difference appearing between the respective bit lines of each bit line pair when the read means reads the information charge of the memory cells. The potential applying means applies, to a bit line, a potential for compensating for change in potential of the bit line, caused by increase of potential of a word line selected by the read means.

In order to attain the above described objects, a semiconductor memory device according to an aspect of the invention includes a plurality of memory cells, a plurality of bit line pairs, a plurality of word lines, read means, a plurality of sense amplifiers, a plurality of dummy cells, a plurality of dummy word lines, potential removing means, and a plurality of word driver circuits. The plurality of memory cells are arranged in a matrix of rows and columns and store information charge. Each of the plurality of bit line pairs includes a pair of bit lines having at least an intersection and the respective bit lines are provided corresponding to the rows of memory cells and they are connected to the memory cells of the corresponding rows. The plurality of word lines are provided corresponding to the columns of memory cells at intersections of the bit lines in the direction intersecting with the bit line pairs and they are connected to the memory cells of the corresponding columns. The read means selects any of the word lines by applying a potential thereto and reads information charge of the memory cells connected to the selected word line onto one of the respective bit lines of the related bit line pair. The plurality of sense amplifiers are provided corresponding to the respective bit line pairs and detect a potential difference appearing between the respective bit lines of the related bit line pair when the information charge of the memory cells is read by the read means. The plurality of dummy cells are provided with a relation of two dummy cells for each bit line and its dummy cell includes a transistor connected to the corresponding bit line through a connection portion. The plurality of dummy word lines are provided corresponding to the respective dummy cells in the direction intersecting with the bit line pairs and they are connected to the corresponding dummy cells with a predetermined potential being applied thereto. The potential removing means is responsive to selection of a word line by the read means to remove the predetermined potential applied to the dummy word lines connected to any of the dummy cells provided corresponding to the bit lines to which the memory cells connected with the selected word lines are connected The plurality of driver circuits are provided corresponding to the respective word lines. The word lines are divided into four word line groups dependent on the positions of the intersections with the bit lines and the word driver circuits are divided into four word driver circuit groups corresponding to the word line groups and drive the corresponding word lines or the word lines adjacent to the corresponding word lines.

The semiconductor memory device thus constructed applies a potential for compensating for influence of potential rise in the selected word lines caused in one of the twisted bit lines, to that bit line and thus improves reliability in read operation.

In order to attain the above described objects, a semiconductor memory device according to another aspect of the invention includes: a semiconductor substrate, a plurality of memory cells, an interlayer insulating film, a plurality of bit line pairs, a plurality of word lines, read means, and a plurality of sense amplifiers. The semiconductor substrate has a main surface. The plurality of memory cells are formed on the main surface of the semiconductor substrate and they are arranged in a matrix of rows and columns and store information charge. The interlayer insulating film is formed on the main surface of the semiconductor substrate to cover the memory cells. The plurality of bit line pairs are formed on the interlayer insulating film and its bit line pair is composed of a pair of bit lines having at least an intersection. The respective bit lines are provided corresponding to the rows of the memory cells and they are connected to the memory cells of the corresponding rows. The plurality of word lines are provided corresponding to the columns of memory cells in the direction intersecting with the bit line pairs and they are connected to the memory cells of the corresponding columns. The read means selects any of the word lines by applying a potential thereto and reads information charge of the memory cells connected to the selected word line onto one of the respective bit lines of the corresponding bit line pair. The plurality of sense amplifiers are provided corresponding to the respective bit line pairs and detect a potential difference appearing between the respective bit lines of the corresponding bit line pair when the information charge of the memory cell is read by the read means. One bit line of each pair is connected through a conductor having a shape of the letter V in section in the twisted portion.

The semiconductor memory device thus constructed connects one of the bit lines of each pair through the conductor of the V shape in section in the twisted portion and thus the area occupied by the twisted portion is not increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 18 is a circuit diagram for generating a signal applied to the dummy word lines of the conventional dynamic semiconductor memory device.

DESCRIPTION OF THE PREFERRED EMBODIMENTS

Figure 1:
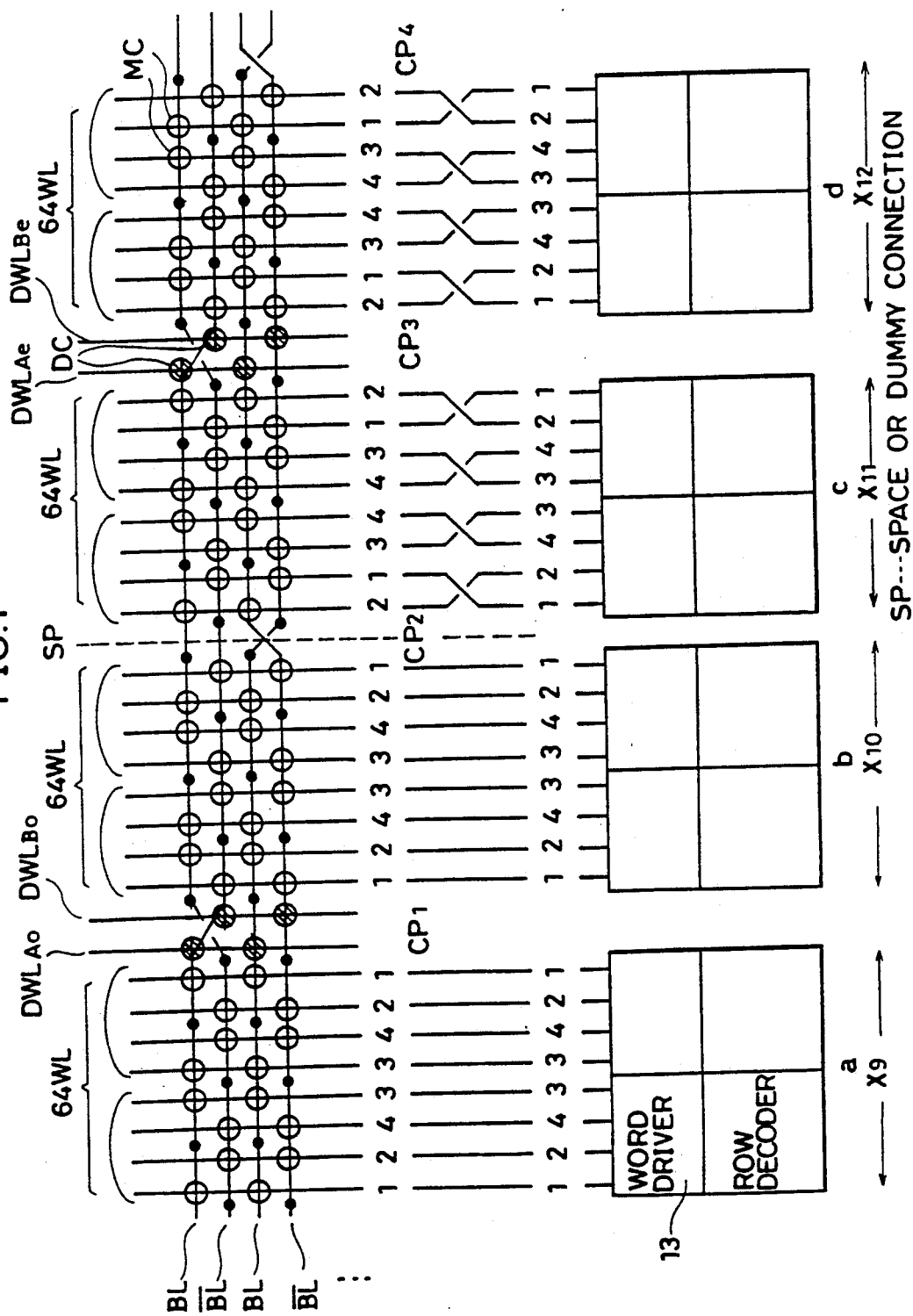
FIG. 1 is an arrangement diagram of a memory cell array according embodiment of the present invention.

In the following, the first embodiment of the present invention will be described with reference to the drawings. FIG. 1 is a configuration diagram of a memory cell array of a 64 K bit semiconductor memory device according to the first embodiment of the invention. This device includes four dummy word lines, two of them being arranged at a twisted portion of each bit line pair, and a part of an output of a word driver is twisted and connected to a word line.

Figure 2:
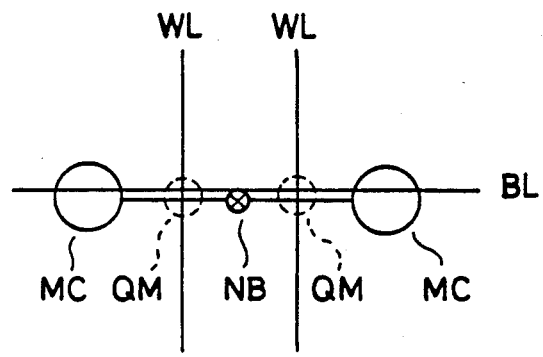
FIG. 2 is an enlarged view of a memory cell portion in FIG. 1.
Figure 16:
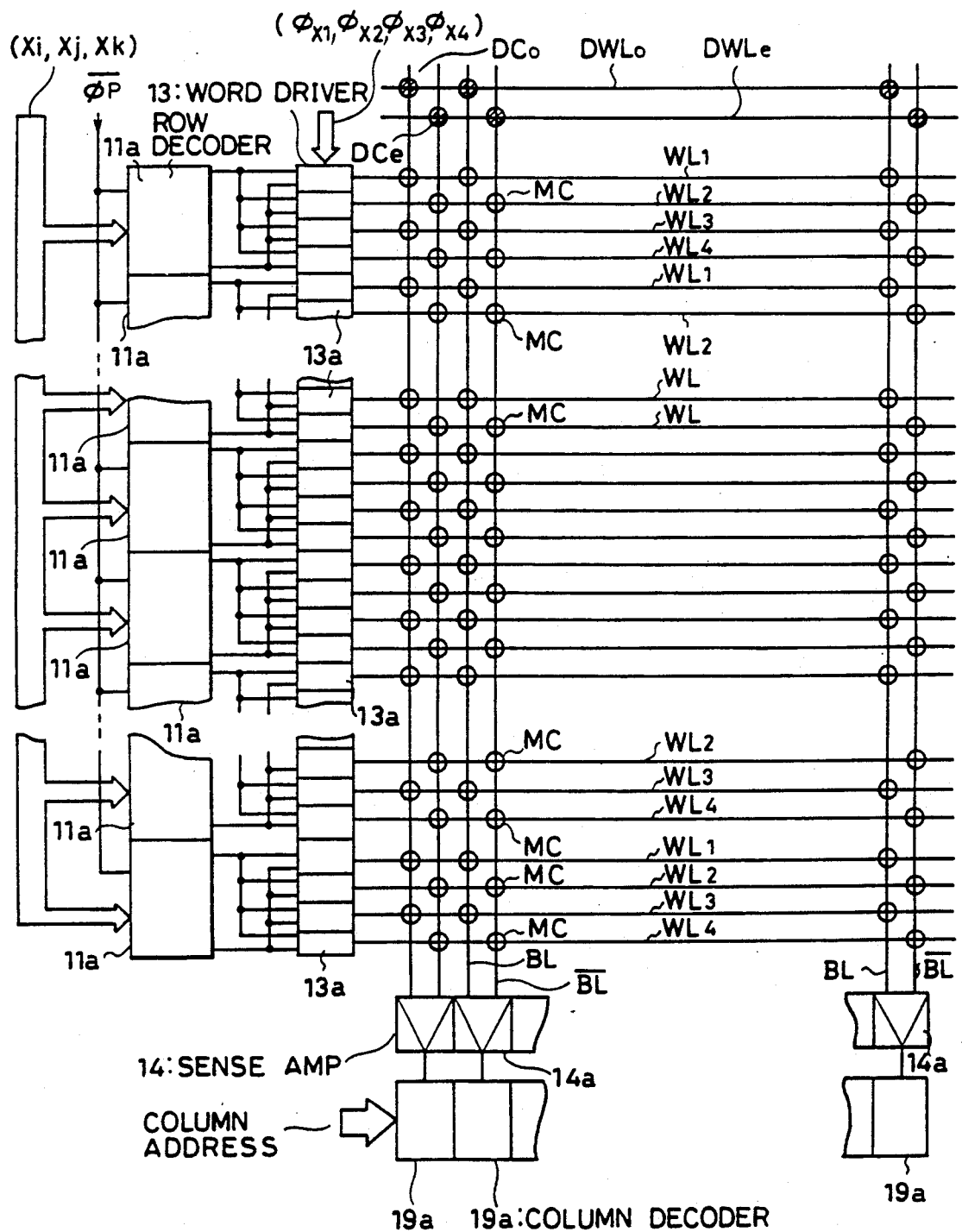
FIG. 16 is a diagram showing a detailed structure of the memory cell array and its peripheral portions in FIG. 13.

Referring to FIG. 1, description is made of the arrangement of the memory cell array of the present invention, the arrangement of the dummy word lines and the driving method thereof. Bit line pairs intersecting in a twisted manner at CP1 and CP3 and bit line pairs intersecting in a twisted manner at CP2 and CP4 are arranged alternately. The intersection CP4 is a point of intersection with a dummy word line and this intersection is added for the purpose of balancing the capacitance for all the bit line pairs. The arrangement of the intersection of the dummy word line is described in detail by the inventors of the present invention in the related copending applications entitled "Dynamic Semiconductor Memory Device" and "Bit Line Structure for Dynamic Type Semiconductor Memory Device". Eight inputs of addresses of A0 to A7 are provided in the direction perpendicular to the bit lines and 260 word lines are arranged corresponding to the eight inputs. The word lines are divided into four blocks a, b, c, and d by the intersections CP1 to CP4 of the bit lines. Two dummy word lines $DWL_{Ao}$ and $DWL_{Bo}$ are arranged at the intersection CP1 as a boundary of the blocks a and b, and two dummy word lines $DWL_{Ae}$ and $DWL_{Be}$ are arranged at the intersection CP3 as a boundary of the blocks c and d. There are 64 word lines for each block; however, in FIG. 1, only eight word lines are arranged for each block for simplification of the illustration. Memory cells are arranged at respective intersections of word lines and bit lines and, in reality, the arrangement is made with one contact for two bits for the purpose of enhancement of the integration scale. In FIG. 1, this layout is shown with the marks O— —O (O indicates a contact position). FIG. 2 shows a relation corresponding to FIG. 7. Dummy cells in FIG. 1 are shown by . One end of each word line is connected to a word driver and a row decoder and this circuit configuration is the same as in FIG. 16. 16 row decoders are provided corresponding to 64 word lines for each block. The output of each word driver is connected to the corresponding word line. In this case, in view of a real layout, the outputs thereof cannot be arranged in the order of QL1, WL2, WL3 and WL4 as shown in FIG. 16 and normally they are arranged in the order as shown in FIG. 1, namely, the order of WL1, WL2, WL4 and WL3. In FIG. 1, the outputs of the word drivers and the numbers of the word lines are denoted by numerals 1,2,3,4. In blocks a and b, the output of each word driver is connected directly to the word line, while in the blocks c and d, the pair of 1 and 2 and the pair of 4 and 3 intersect in a twisted manner respectively so as to be connected to the word lines. In this manner, the logic of selection of the dummy word lines can be remarkably simplified as described later.

The blocks a, b, c and d are selected by row selection signals X9, X10, X11, X12, respectively, generated by the row address signals RA6 and RA7. More specifically, the row selection signal X9 is inputted to all the row decoders of the block a as the row selection signal Xk for the row decoders shown in FIG. 16, and the signal X10 is inputted to the row decoders of the block b as the signal Xk.

Next, the method of selection of the dummy word lines in such a memory cell array will be described. The selection is effected in the following manner.

(1) If one of the word lines WL1 and WL3 of the block a is selected, $DWL_{Ao}$ is selected; and if one of the word lines WL2 and WL4 of the block a is selected, $DWL_{Ae}$ is selected.

(2) If one of the word lines WL! and WL3 of the block b is selected, $DWL_{Bo}$ is selected; and if one of the word lines WL2 and WL4 of the block b is selected, $DWL_{Be}$ is selected.

(3) If one of the word lines WL1 and WL3 of the block c is selected, $DWL_{Ao}$ is selected; and if one of the word lines WL2 and WL4 of the block c is selected, $DWL_{Ae}$ is selected.

(4) If one of the word lines WL1 and WL3 of the block d is selected, DWLBo is selected; and if one of the word lines WL2 and WL4 of the block d is selected, $DWL_{Be}$ is selected.

Thus, the potentials of the selected dummy word lines are lowered.

By the above described selection, dummy cells corresponding normally to the selected memory cells are obtained for all the bit lines.

Figure 3:
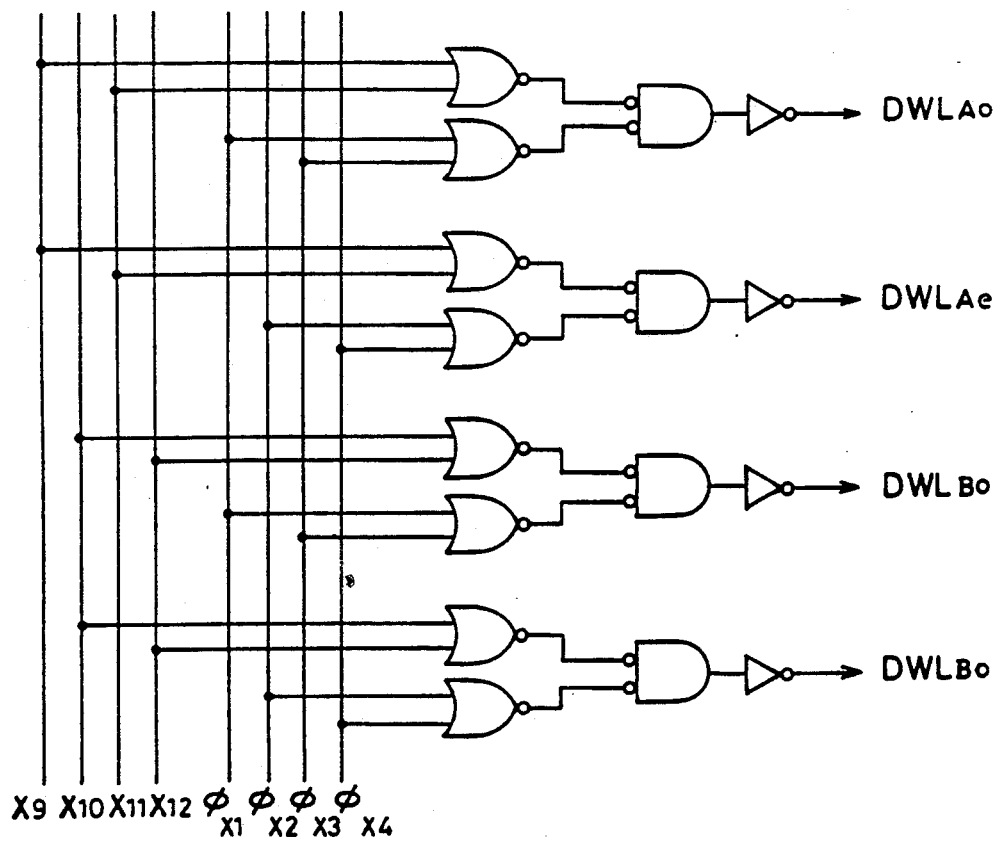
FIG. 3 is a circuit diagram for generating a signal applied to the dummy word lines in FIG. 1.
Figure 17:
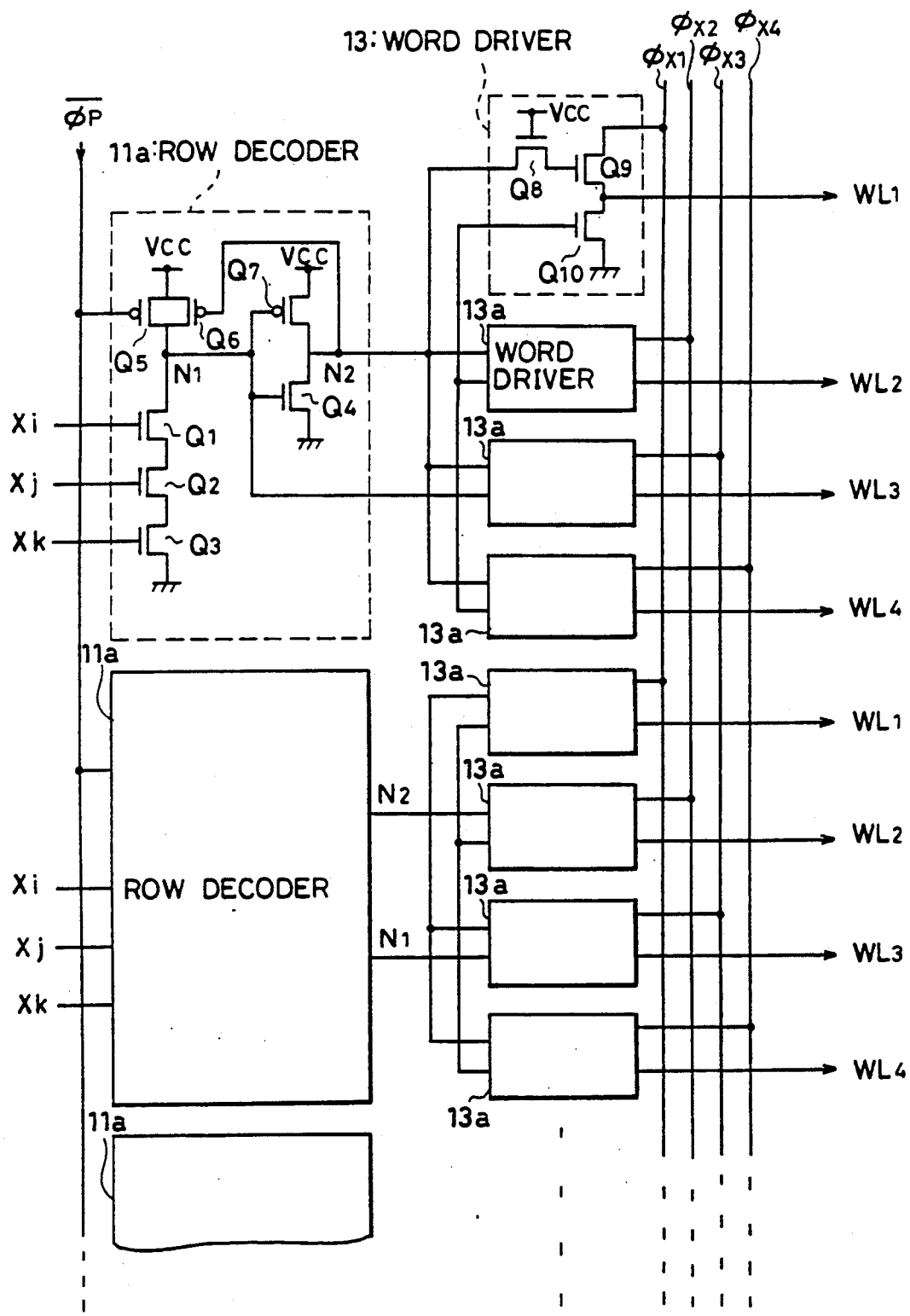
FIG. 17 is a circuit diagram showing a further detailed structure of the main portion in FIG. 16.
Figure 19:
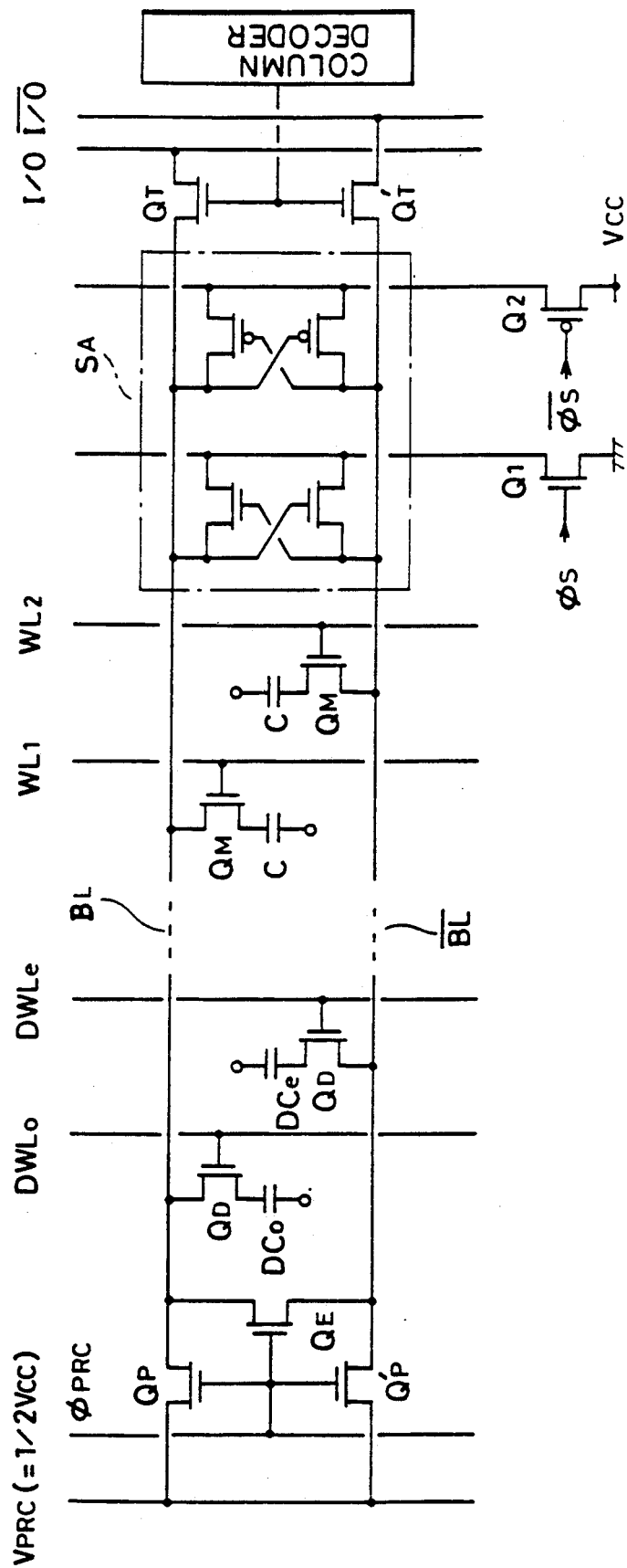
FIG. 19 is a circuit diagram showing a structure around the pair of bit lines in FIG. 16.
Figure 20:
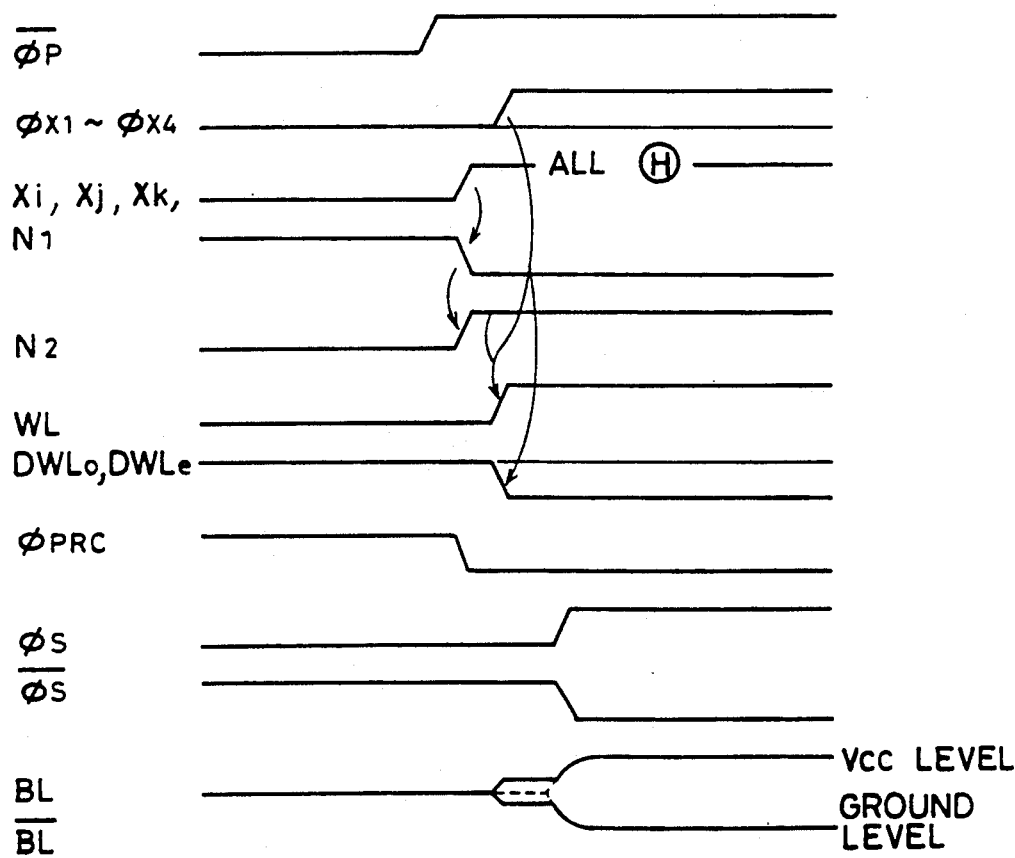
FIG. 20 is a timing chart for explaining operation of the conventional dynamic semiconductor memory device.
Figure 21:
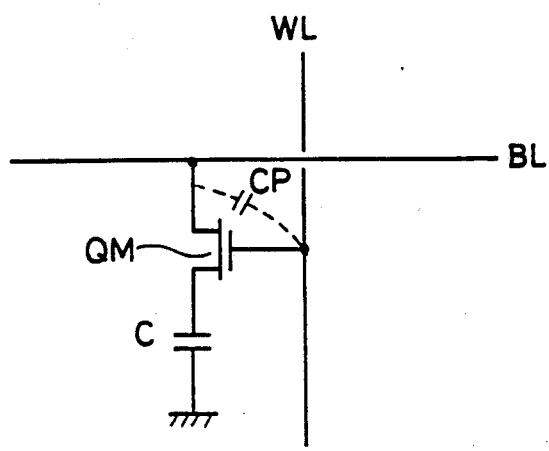
FIG. 21 is a circuit diagram for explaining a potential change in the bit line caused by selection of the word line.
Figure 22:
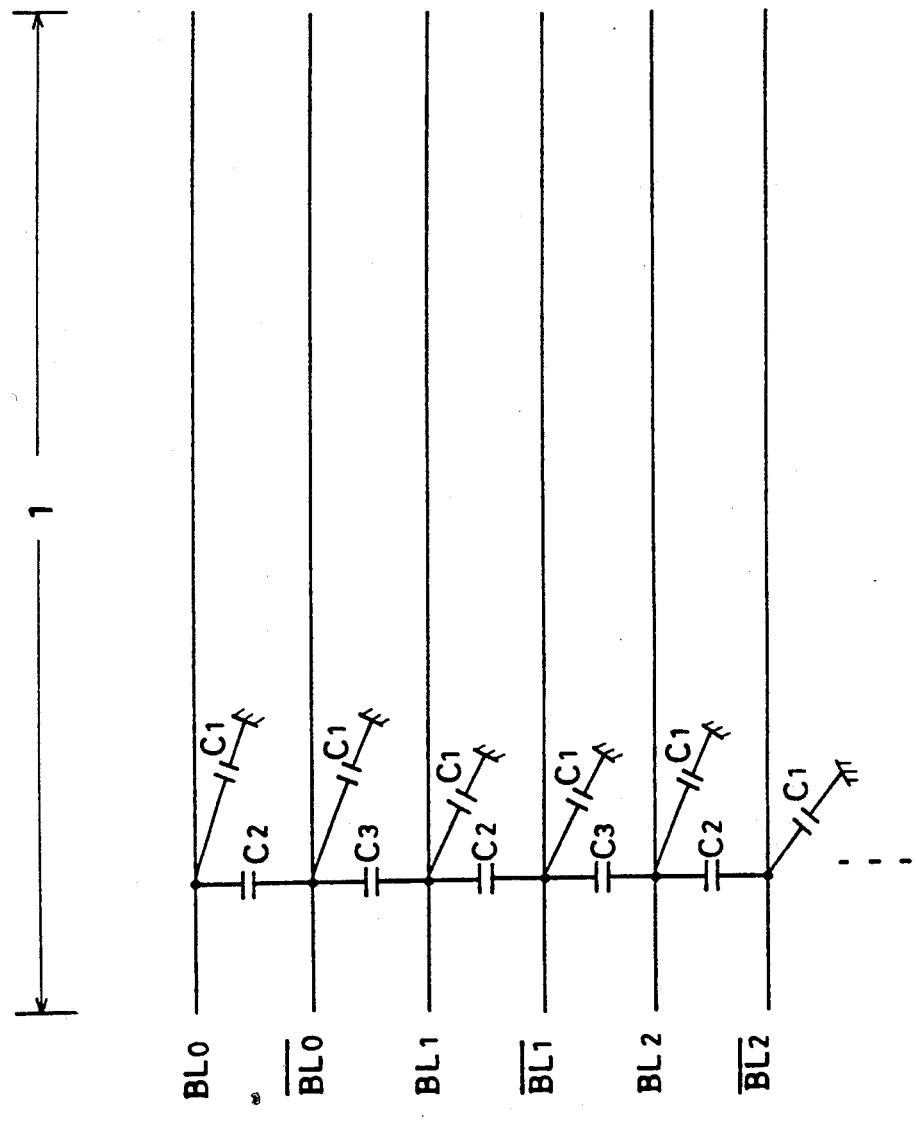
FIG. 22 is a diagram showing parasitic capacitance existing in the conventional bit lines.
Figure 23:
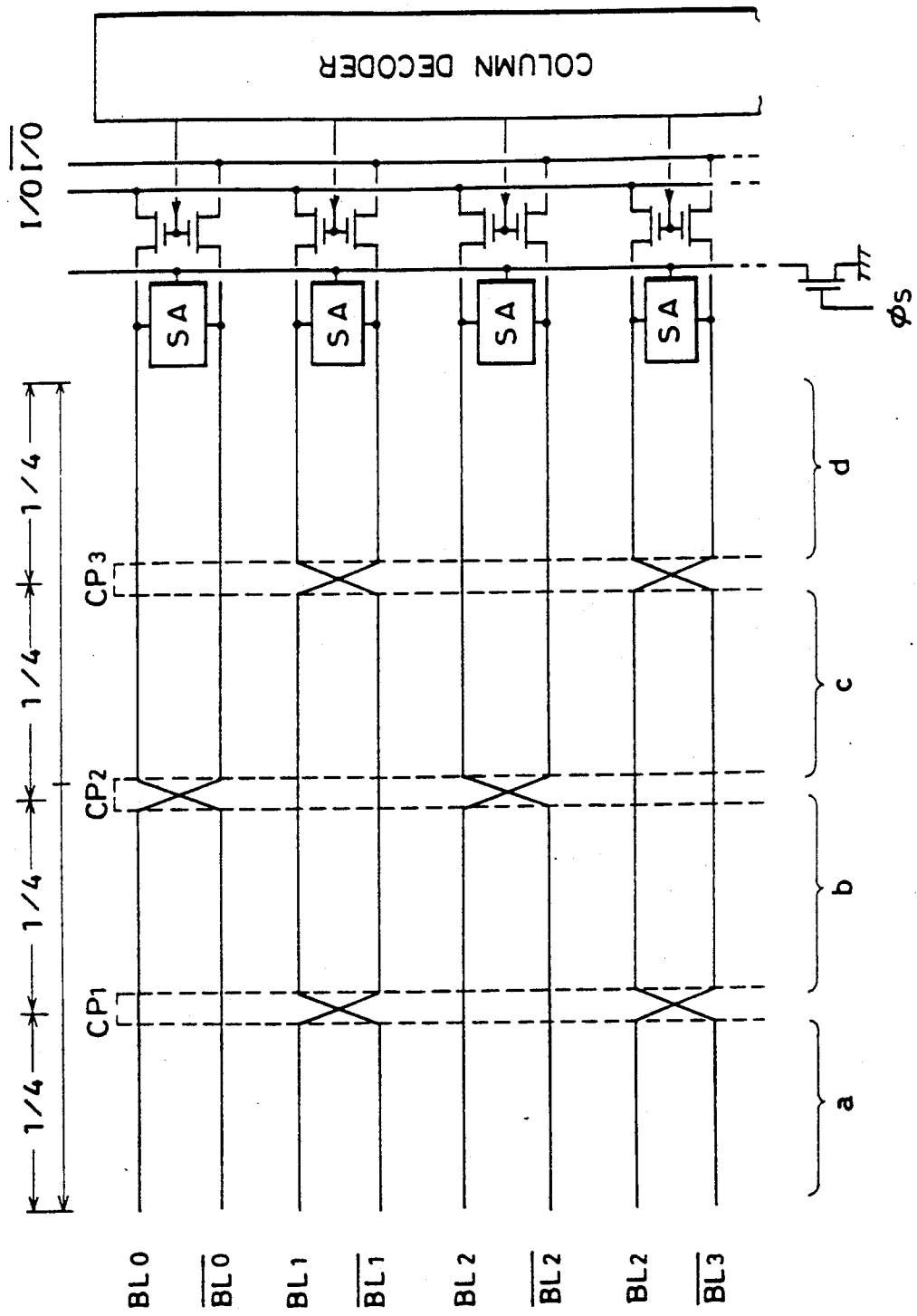
FIG. 23 is a structure diagram of bit lines of a dynamic semiconductor memory device of a twisted bit line system.
Figure 24:
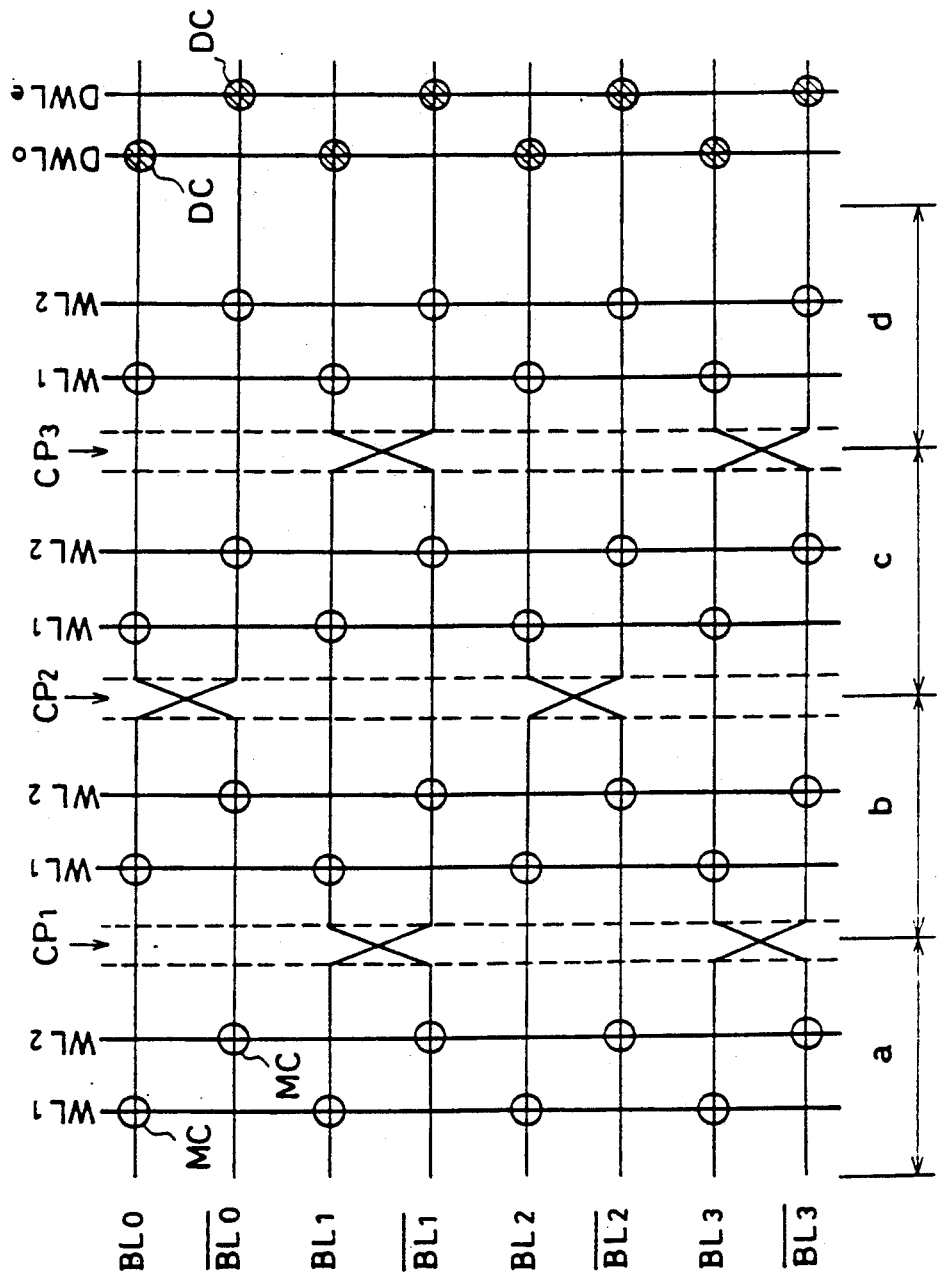
FIG. 24 is an estimated diagram in the case of applying a conventional dummy cell system to the semiconductor memory device of the twisted bit line system shown in FIG. 23.

FIG. 3 is a logic view showing an example of such a specified selection of dummy word lines taking account of the selection of the blocks a, b, c and d by the row selection signals X9, X10, X11 and X12, respectively. FIG. 3 corresponds to FIG. 17 concerning the conventional device.

The signals X9 to X12 are generated from the row address signals RA6 and RA7 as described previously in connection with FIG. 10 related with the conventional device. Those signals are generated for example by the combinations as indicated below.

| Combination of input signals | | Output signals |
|---|---|---|
| RA6 | RA7 | X9 |
| $\overline{RA6}$ | RA7 | X10 |
| RA6 | $\overline{RA7}$ | X11 |
| $\overline{RA6}$ | $\overline{RA7}$ | X12 |

Figure 14:
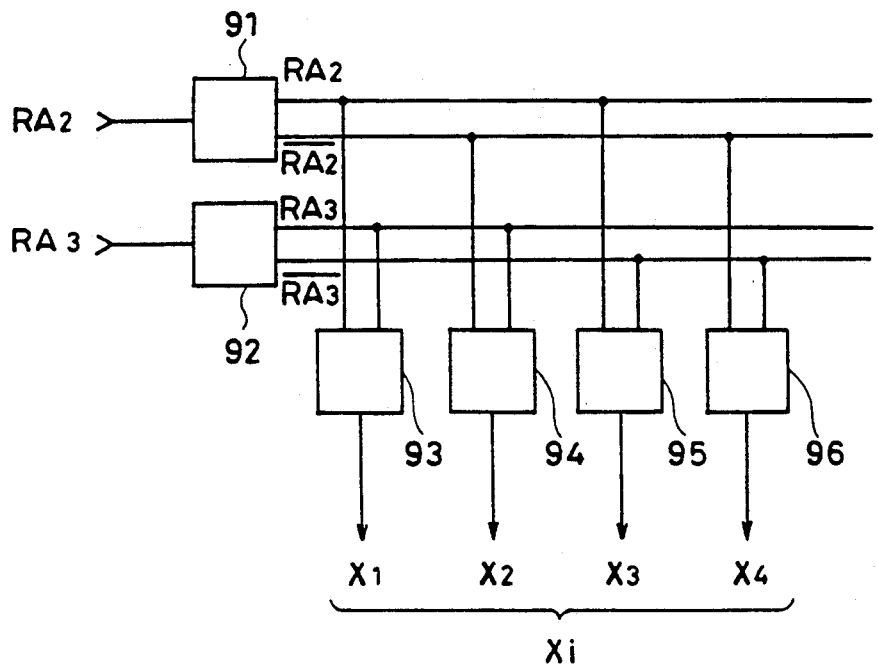
FIG. 14 is a diagram showing a detailed structure of the main part of the $\phi x$ subdecoder in FIG. 13.
Figure 15:
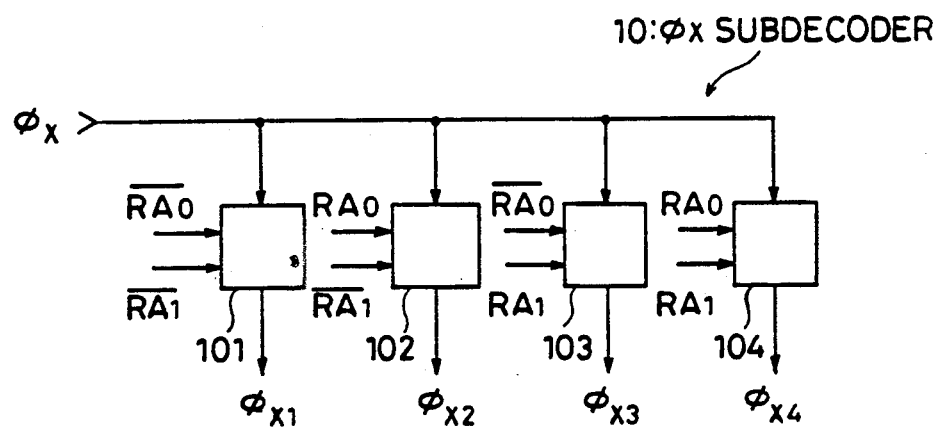
FIG. 15 is a diagram showing a detailed structure of $\phi x$ subdecoder 13.

Similarly, as shown in FIG. 14, the signals $\phi x1$ to $\phi x4$ are generated from the row address signals RA0 and RA1 by the combinations as shown below.

| Combination of input signals | | Output signals |
|---|---|---|
| $\overline{RA0}$ | $\overline{RA1}$ | $\phi x1$ |
| RA0 | $\overline{RA1}$ | $\phi x2$ |
| $\overline{RA0}$ | RA1 | $\phi x3$ |
| RA0 | RA1 | $\phi x4$ |

Figure 4:
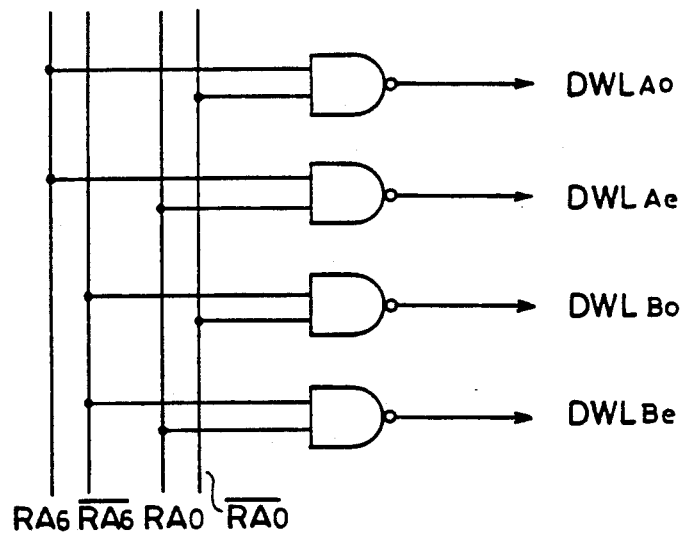
FIG. 4 another circuit diagram for generating a signal applied to the dummy word lines in FIG. 1.

Consequently, when RA6 is at H level, X9 or X11 is generated and when RA6 is at H level, X10 or X12 is generated. Similarly, when RA0 is at H level, $\phi x1$ or $\phi x3$ is generated and when RA0 is at H level, $\phi x2$ or $\phi x4$ is generated. In view of those relations, if RA6 and RA0 are used as decode signals in place of X9 to X12 and $\phi x1$ to $\phi x4$, respectively, for selection of dummy word lines, the logic of selection of dummy word lines can be more simply realized. Such a concrete example is shown in FIG. 4. For the purpose of simplification of the logic, the outputs of the word drivers are twisted and connected to the word lines in the blocks c and d.

Figure 5:
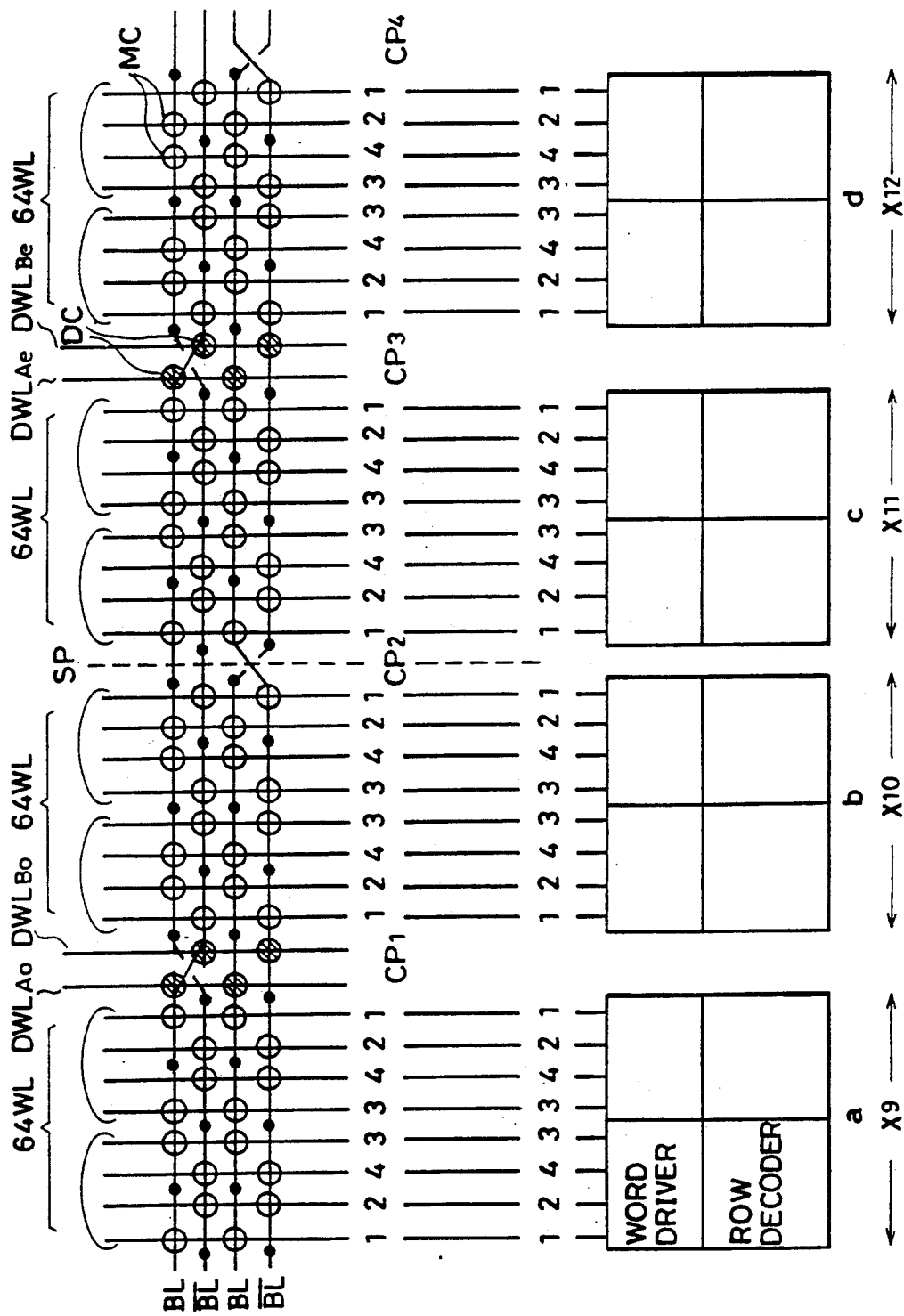
FIG. 5 is an arrangement diagram of a memory cell array according to another embodiment of the invention.

FIG. 5 shows the second embodiment of the invention. In this embodiment, the outputs the word drivers do not intersect in the blocks c and d and they are directly connected to the word lines. The dummy word lines in this embodiment are selected in the following manner, so that the potentials thereof are lowered.

(1) If the word lines WL1 and WL3 of the block a are selected, $DWL_{Ao}$ is selected; and
if the word lines WL2 and WL4 of the block a are selected, $DWL_{Ae}$ is selected.
(2) If the word lines WL1 and WL3 of the block b are selected, $DWL_{Bo}$ is selected; and
if the word lines WL2 and WL4 of the block b are selected, $DWL_{Be}$ is selected.
(3) If the word lines WL1 and WL3 of the block c are selected, $DWL_{Ae}$ is selected; and
if the word lines WL2 and WL4 of the block c are selected, $DWL_{Ao}$ is selected.
(4) If the word lines WL1 and WL3 of the block d are selected, $DWL_{Be}$ is selected; and
if the word lines WL2 and WL4 of the block d are selected, $DWL_{Bo}$ is selected.

The logic of selection of dummy word lines in this case is a little more complicated but this can be realized in the same manner as described above.

Figure 6:
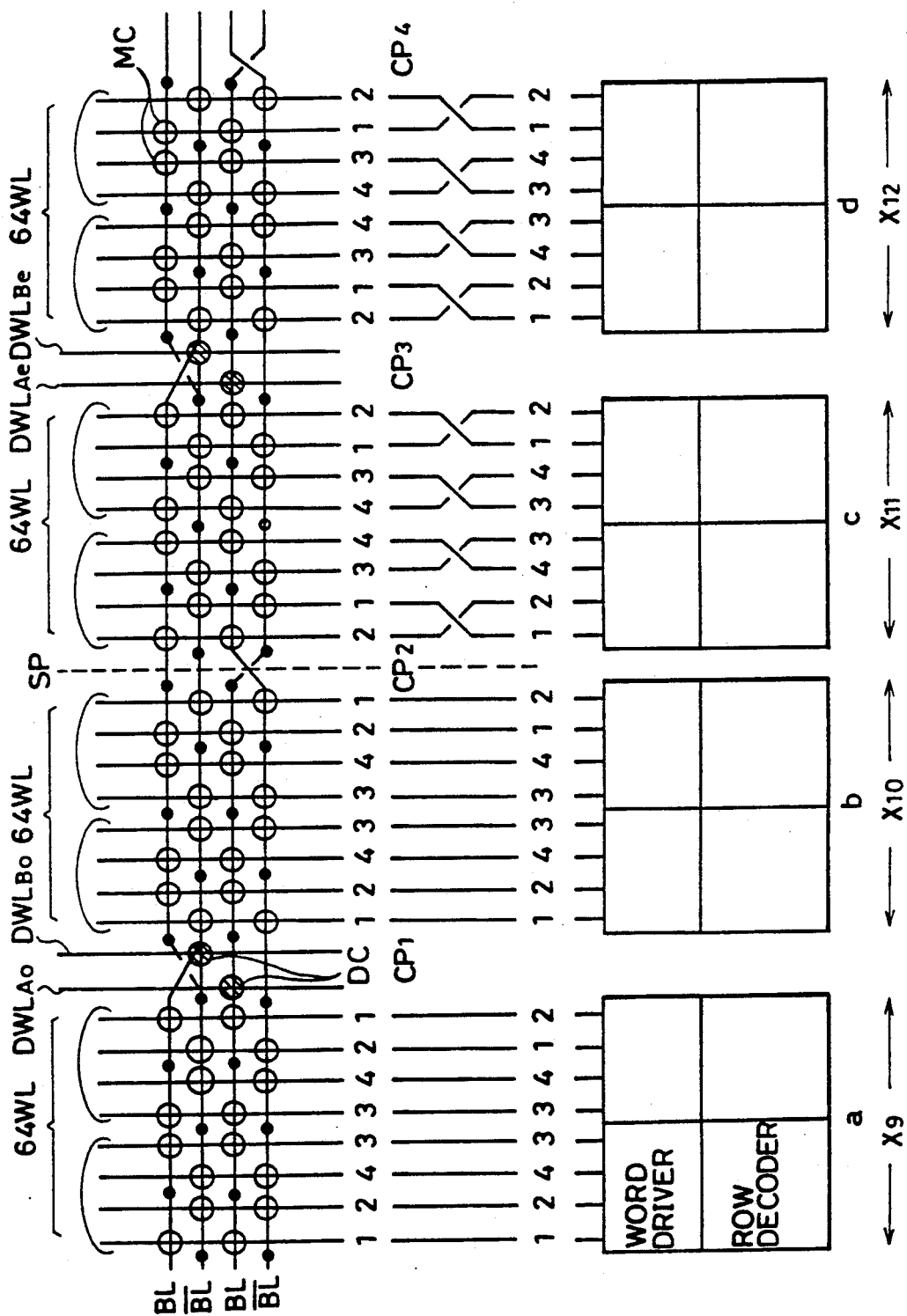
FIG. 6 is an arrangement diagram of a memory cell array according to a further embodiment of the invention.

FIG. 6 shows the third embodiment of the invention. In this embodiment, two dummy word lines out of four dummy word lines are selected so that the potentials thereof are lowered. Although two dummy cells are provided for each bit line in the above described first and second embodiments, one dummy cell is provided for each bit line in this third embodiment. The selection of dummy word lines in this embodiment is as follows.

(1) If the word lines WL1 and WL3 of the block a are selected, $DWL_{Ao}$ and $DWL_{Be}$ are selected; and
if the word lines DWL2 and DWL4 of the block a are selected, $DWL_{Ae}$ and $DWL_{Bo}$ are selected.
(2) If the word lines WL1 and WL3 of the block b are selected, $DWL_{Ao}$ and $DWL_{Bo}$ are selected; and
if the word lines WL2 and WL4 of the block b are selected, $DWL_{Ae}$ and $DWL_{Be}$ are selected.
(3) If the word lines WL1 and WL3 of the block c are selected, $DWL_{Ao}$ and $DWL_{Be}$ are selected; and
if the word lines WL2 and WL4 of the block c are selected, $DWL_{Ae}$ and $DWL_{Bo}$ are selected.
(4) If the word lines WL1 and WL3 of the block d are selected, $DWL_{Ao}$ and $DWL_{Bo}$ are selected; and
if the blocks WL2 and WL4 of the block d are selected, $DWL_{Ae}$ and $DWL_{Be}$ are selected.

In this case also, it goes without saying that the logic of selection of dummy word lines can be realized in the same manner.

Although in the above described embodiment, two dummy word lines are arranged at each of the intersection portions CP1 and CP3 of the bit lines, other combination of arrangement of dummy word lines at other intersection portions may be adopted.

However, it is theoretically possible to provide dummy word lines not at intersection portions but at the portions of bit line pairs other than the intersection portions. In such a case, the logic of selection of dummy word lines becomes very complicated and such arrangement is not preferable for control.

Further, all the above described embodiments adopt the so-called dummy reversal system which selects dummy cells connected to the same bit lines as those connected with the selected memory cells. However, the present invention is also applicable to a same phase dummy system which selects dummy cells connected to the bit lines opposite to those connected with the selected memory cells.

Next, the structure of the twisted intersection portions of the bit lines will be described.

Figure 7:
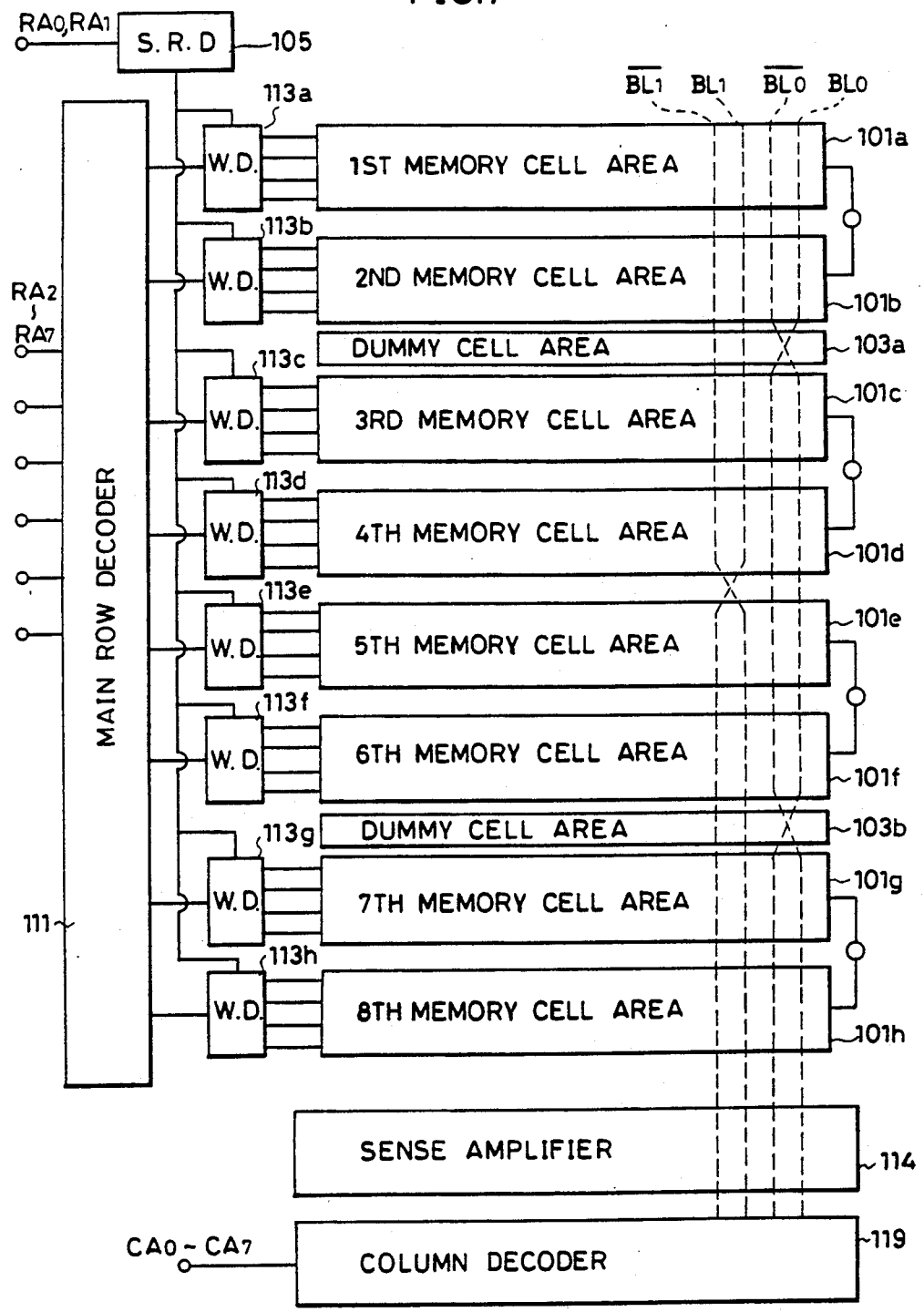
FIG. 7 is a schematic plan view showing a specified layout of a DRAM according to each of the above described embodiments.

FIG. 7 is a schematic plan view showing a specified layout of a DRAM according to each of the above described embodiments.

Referring to FIG. 7, the structure will be described. Memory cell areas include eight areas 101a to 101h. A dummy cell area 103a is provided between the second and third memory cell areas 101b and 101c. A dummy cell area 103b is provided between the sixth and seventh memory cell areas 101f and 101g. Bit line pairs BL0—BL0, BL1—BL1 etc. are arranged to connect the respective memory cell areas, and ends of bit line pairs are connected through a sense amplifier 114 to a column decoder 119 to which column addresses CA0 to CA7 are inputted. Each bit line pair has one or two twisted portions in the memory cell areas, the numbers of the twisted portions being different between the adjacent bit line pairs. The twisted portions are located on the dummy cell area 103a or 103b. Each memory cell area is connected with four word lines drawn from the respective word drivers 113a to 113h. A main row decoder 111 to which row addresses RA2 to RA7 are inputted and a sub row decoder 105 to which row addresses RA0 and RA1 are inputted are connected to each of the word drivers, and any word driver is selected based on the corresponding row address.

The operation of the DRAM thus structured has been already described in connection with the previously mentioned respective embodiments and therefore the description is not repeated.

Figure 8:
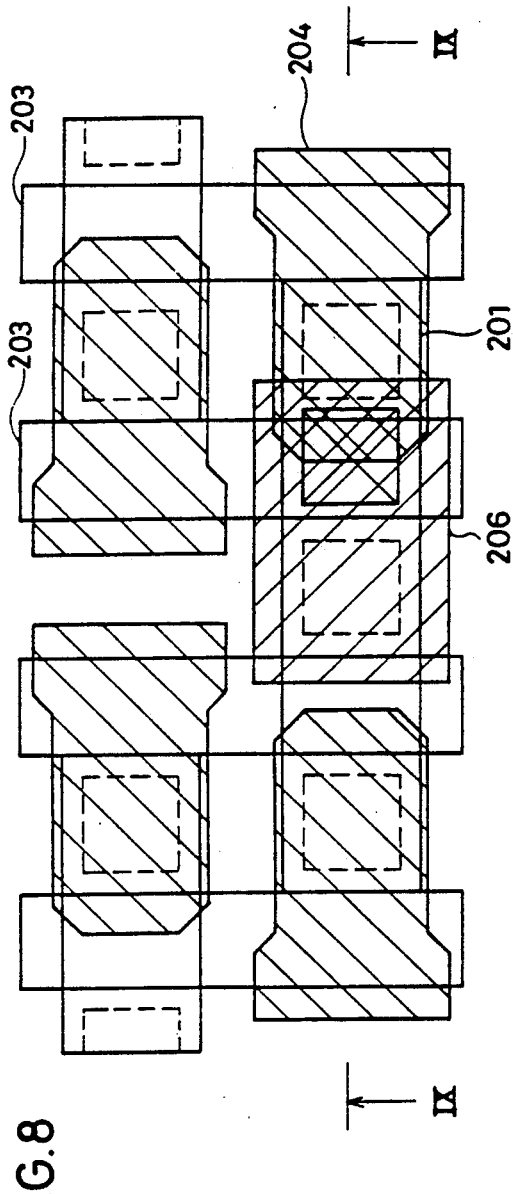
FIG. 8 is a plan view showing a specified structure of the memory cell array in FIG. 1.
Figure 9:
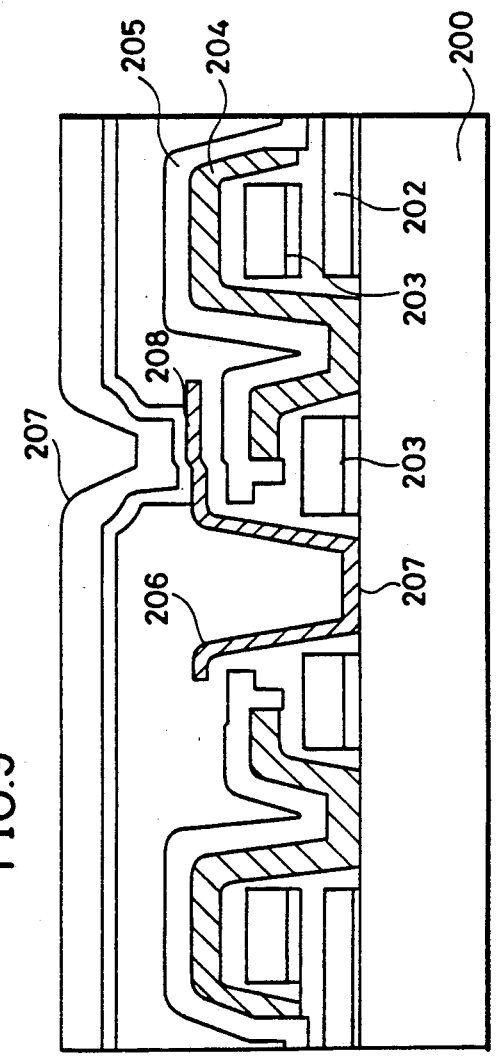
FIG. 9 is a sectional view taken along the line IX—IX in FIG. 8.

FIG. 8 is a plan view of memory cells suited for a high degree of integration and FIG. 9 is a sectional view taken along IX—IX in FIG. 8.

The sectional view of FIG. 9 shows the structure of two memory cells. Referring to FIG. 9, an active region 201 is isolated by a field shield electrode 202 on the main surface of a semiconductor substrate 200. The field shield electrode 202 is formed of polysilicon or the like and it is fixed to the ground potential or a potential lower than the ground potential. A word line 203 is formed on the active region of the semiconductor substrate 200 through an insulating film and the word line 203 functions as a gate electrode of a transistor for memory cells selection. A charge storage layer 204 and a cell plate electrode 205 serving as a capacitor are formed between the memory cell selection transistor and the field shield electrode. A polypad (polysilicon pad) 206 is formed through a contact on the main surface of the semiconductor substrate 200 between the two memory cell selection transistors. The polypad 206 has a section formed like the letter V and a part of the polypad extends over the capacitor of the memory cell. A bit line 207 is connected through a contact 208 on the polypad 206 and over the capacitor. In this manner, the contact 208 for the bit line is located not on the main surface of the semiconductor substrate 200 as in the prior art but near the bit line. Accordingly, the size of the contact hole 208 can be made small compared with the prior art and consequently the polypad 206 contributes to enhancement of the integration scale of the device. In the plan view of FIG. 8, the cell plate 205 and the bit line 207 are omitted from the illustration for the purpose of simplification.

Figure 10:
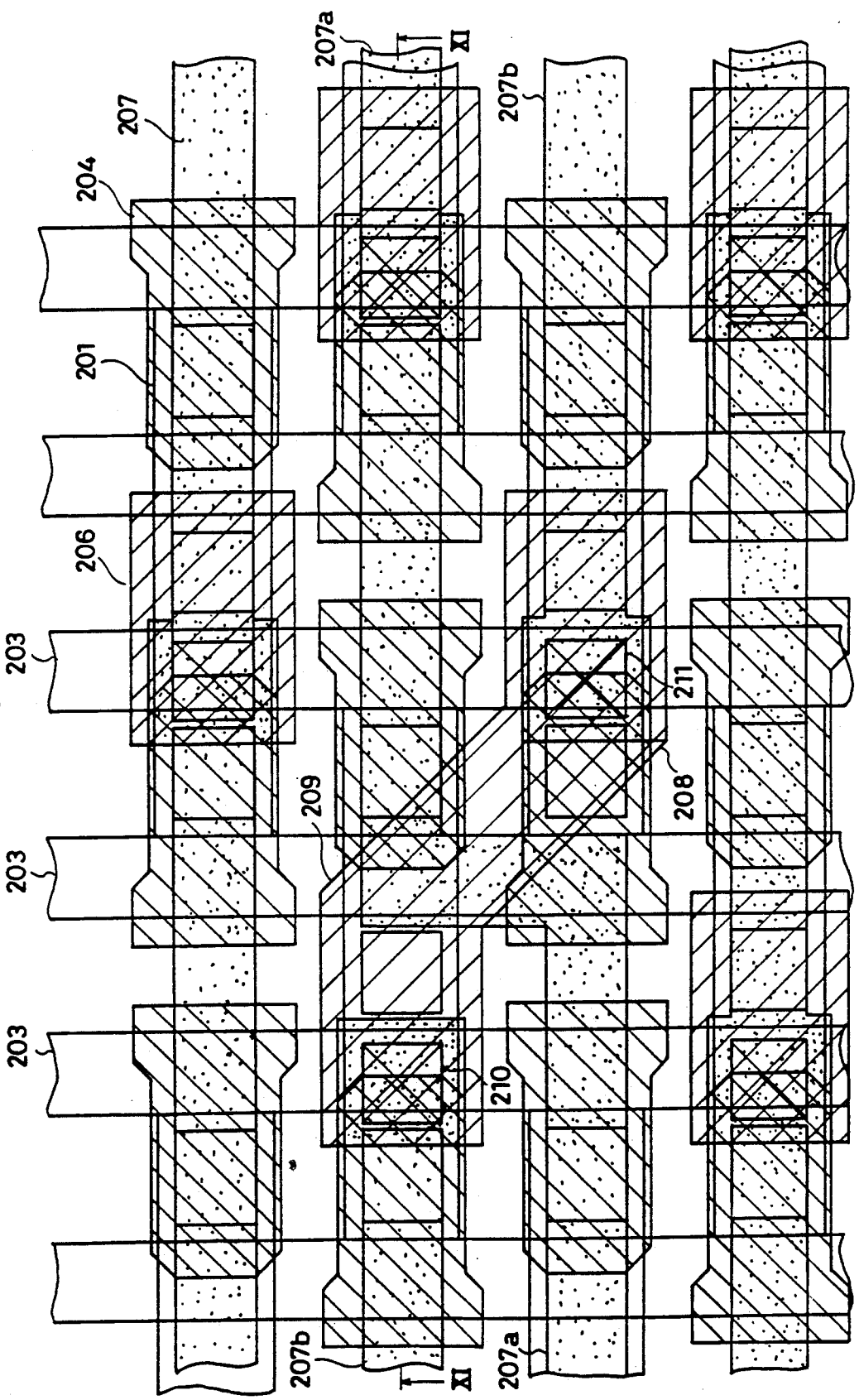
FIG. 10 is a plan view showing a concrete structure of twisted portions of the bit line pairs in FIG. 1.
Figure 11:
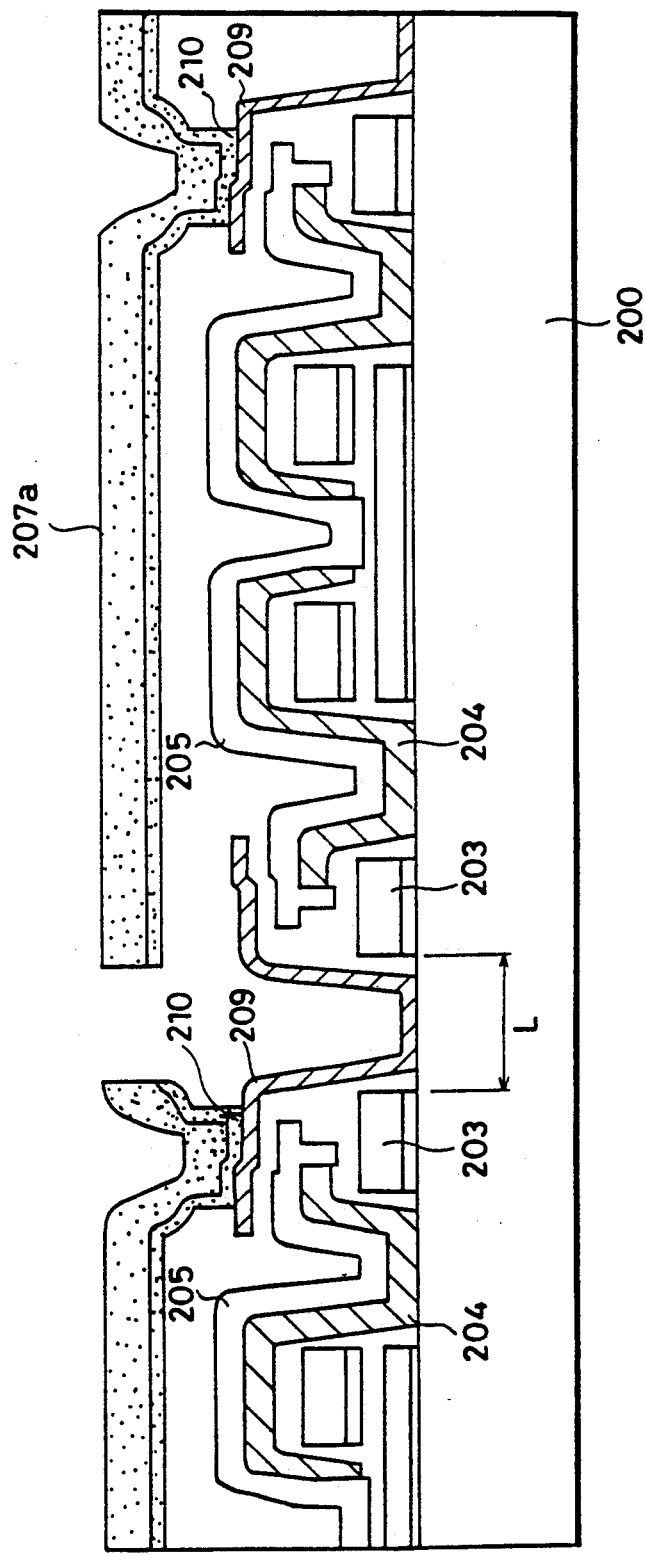
FIG. 11 is a sectional view taken along XI—XI in FIG. 10.

FIG. 10 is a plan view of a memory cell array suited for enhancement of the integration scale, including twisted portions of bit lines. FIG. 11 is a sectional view taken along XI—XI in FIG. 10.

Figure 25:
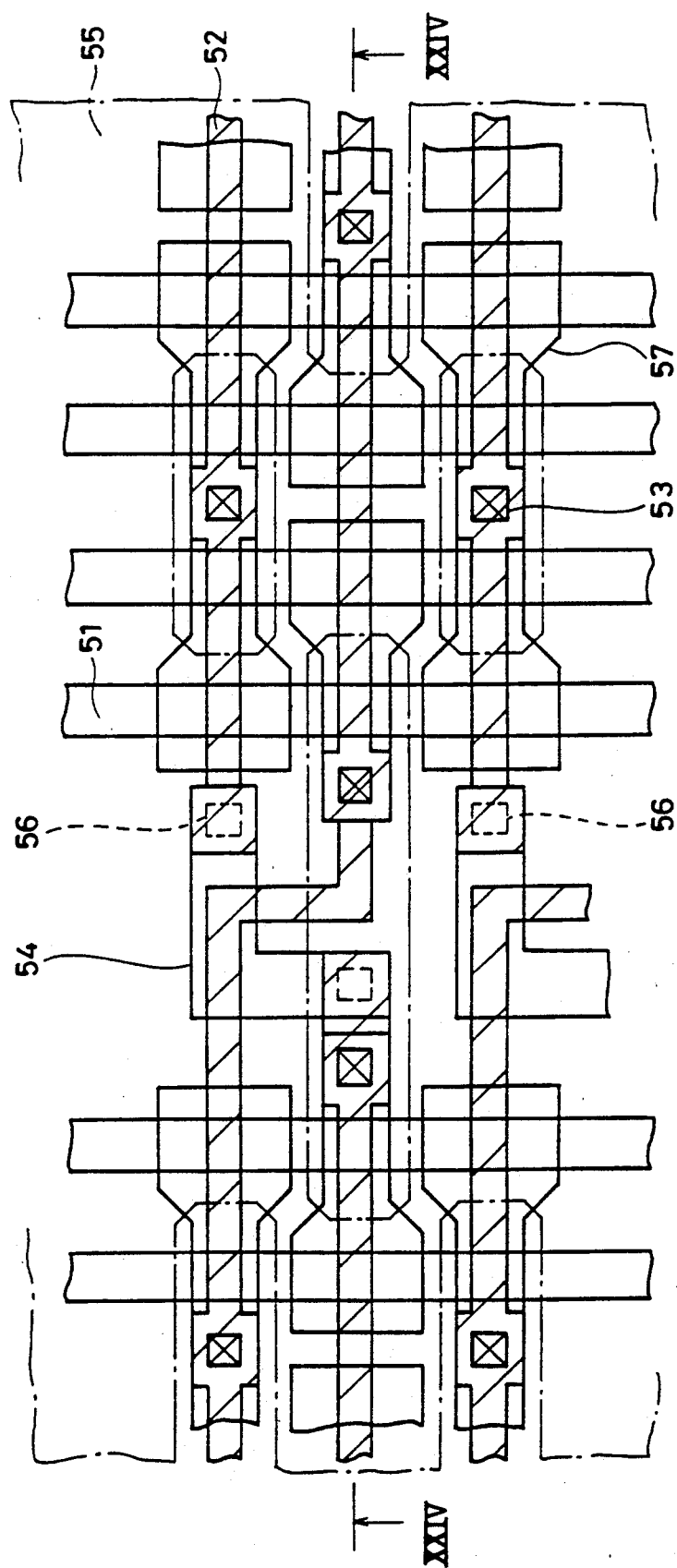
FIG. 25 is a plan view showing a concrete structure of intersection portions of conventional bit lines.
Figure 26:
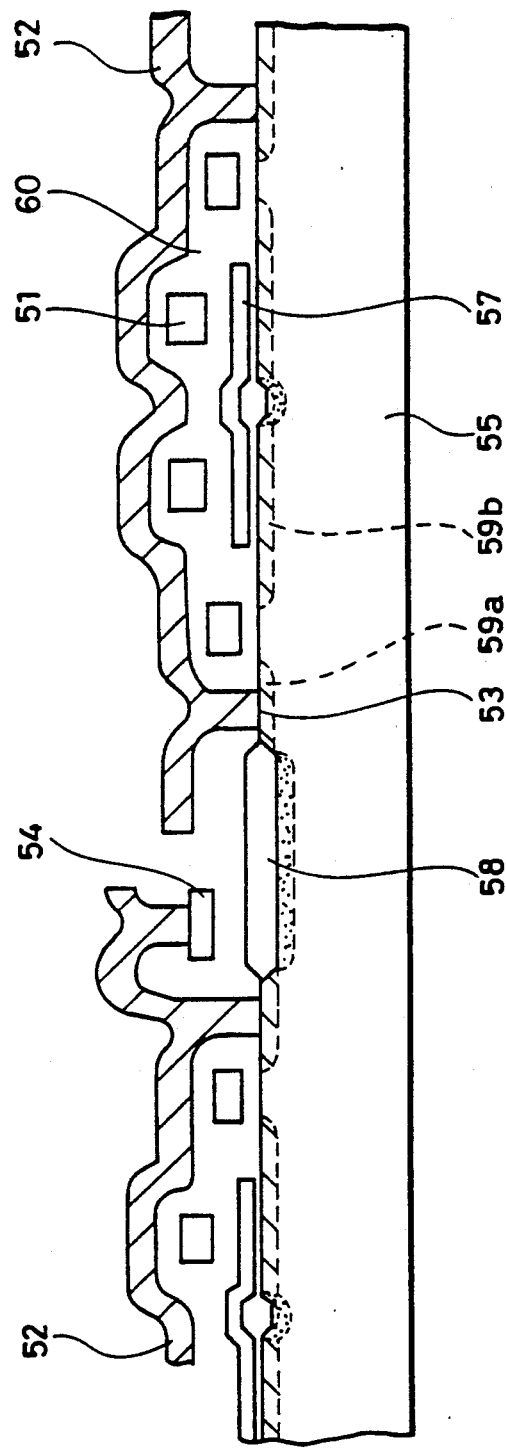
FIG. 26 is a sectional view taken along XXVI-XXVI in FIG. 25.

The plan view and sectional view of the memory cells in those figures are the same as in FIGS. 8 and 9. Therefore, the structure of the intersection portion of the bit lines 207a and 207b will be described in the following. The bit line 207a is distant from the semiconductor substrate 200 at a constant distance even at its intersection portion and extends through the intersection portion in the same plane. On the other hand, the bit line 270b is connected to the polypad 209 through the contacts 210 and 211 at the intersection portion and extends through the intersection portion. The polypad 209 has the same structure as that of the polypad 206 shown in FIG. 9 and it has a section formed like the letter V. Accordingly, the dimension (the size L) for the polypad 209 to contact the main surface of semiconductor substrate 200 may be equal to a width between the word lines 203 shown in FIG. 9. More specifically, if the bit line 207b is connected at the twisted portion through the polypad 209 of such structure, the twisted portion of the bit lines does not need to have a special region as shown in FIG. 25 concerning the conventional device. As a result, the twisted portions of the bit lines required for enhancement of the integration scale of the device do not obstruct the enhancement of the integration scale.

FIGS. 12A to 12H are sectional views schematically showing steps of a method of manufacturing memory cells of the structure shown in FIG. 9.

In the following, the manufacturing method will be briefly described with reference to the drawings.

Figure 12A:
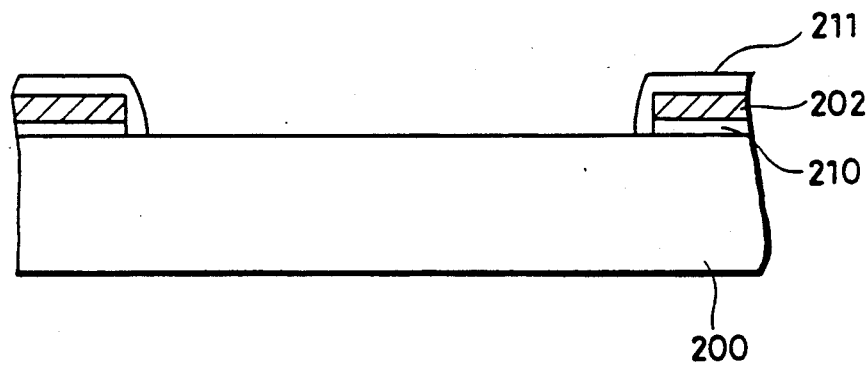
FIG. 12A to 12H are schematic process views showing a method of memory cells shown in FIG. 9.

An oxide film 210 and a polysilicon layer 202 are formed on the main surface of the semiconductor substrate 200 and patterning of a prescribed form is applied thereto. The polysilicon layer 202 becomes a field shield electrode, and an oxide film 211 is formed on the main surface of the semiconductor substrate 200 to cover this electrode. The oxide film 211 is anisotropically etched, so that the main surface of the semiconductor substrate in an active region between the field shield electrodes 202 is exposed (as shown in FIG. 12A).

Figure 12B:
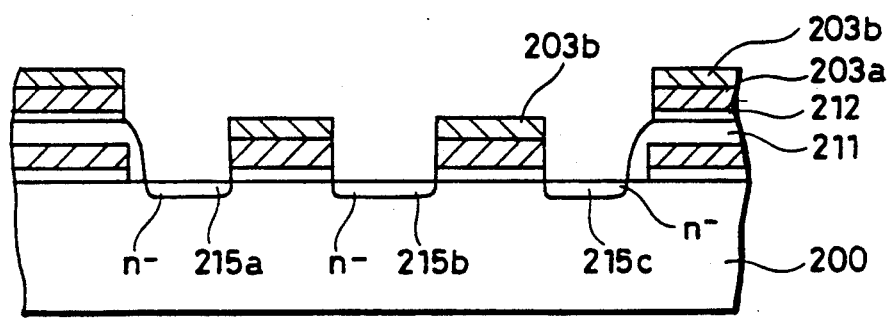

An oxide film 212, a polysilicon layer 203a and a tungsten silicide layer 203b are formed successively over the whole surface of the main surface of the semiconductor substrate 200 including the oxide film 211. Those three layers are patterned in a prescribed form, so that word lines are formed, with three areas of the main surface of the semiconductor substrate 200 being exposed. Using the pattern tungsten silicide layer 203b as a mask, n type impurity is injected into the main surface of the exposed semiconductor substrate 200, so that n⁻ type impurity regions 215a, 215b and 215c are formed (as shown in FIG. 12B).

Figure 12C:
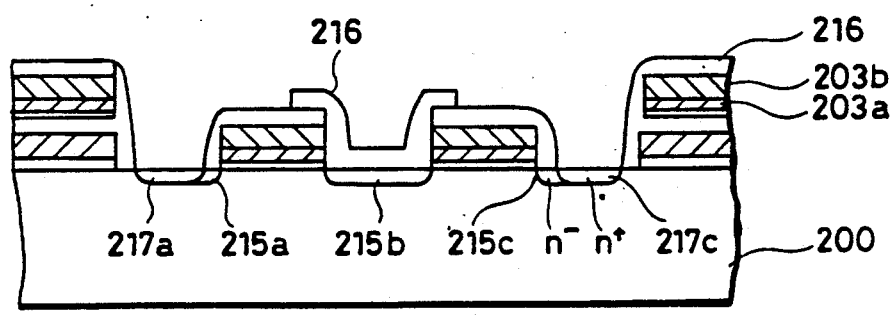

Then, an oxide film 216 is deposited over the whole main surface of the semiconductor substrate 200. Subsequently, the oxide film 216 is anisotropically etched. On this occasion, the oxide film of the region over the impurity region 215b is protected by a mask so that it is prevented from being etched. Using the oxide film 216 as a mask, impurity As is injected into the impurity regions 215a and 215c on the main surface of the semiconductor substrate 200, exposed by openings formed by the anisotropic etching in a self-alignment manner. Thus, n⁺ type impurity regions 217a and 217c; are formed on the main surface of the semiconductor substrate 200 (as shown in FIG. 12C).

Figure 12D:
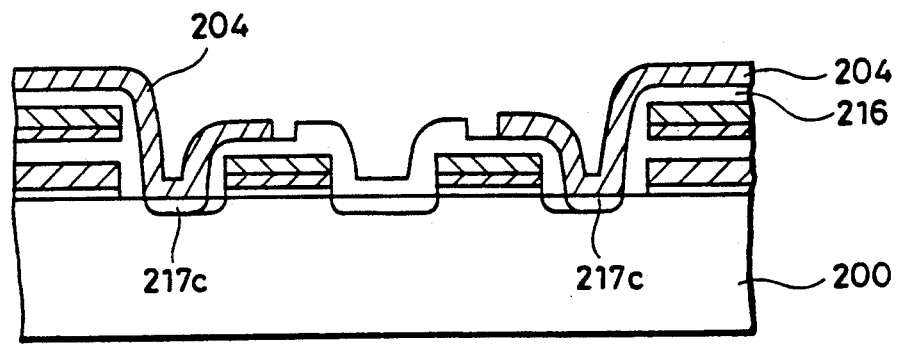

Then, a storage node 204 is formed over the whole surface to cover the exposed areas of the main surface of the semiconductor substrate 200 and this storage node 204 is patterned in a prescribed form (as shown in FIG. 12D).

Figure 12E:
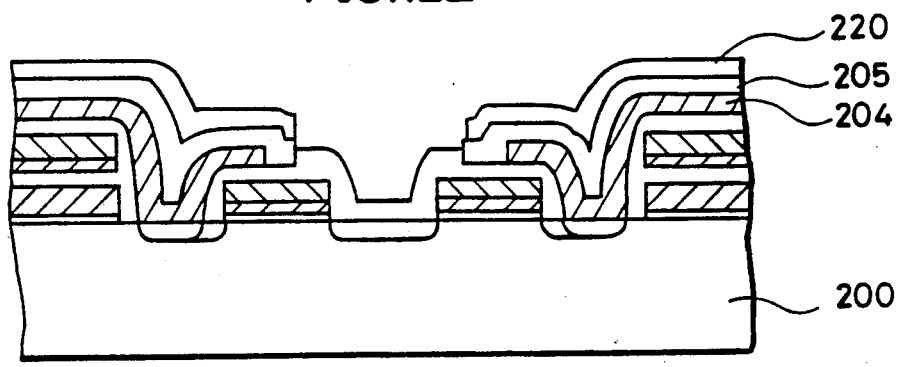

A polysilicon layer 205 and an oxide film 220 are deposited successively over the storage nodes 204 and those two layers are patterned in a prescribed form so that cell plates are formed (as shown in FIG. 12E)

Figure 12F:
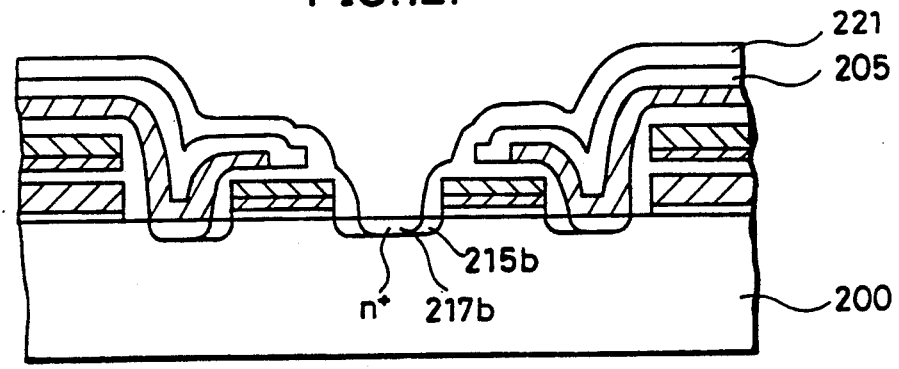

An oxide film 221 is formed over the whole surface to cover the cell plates and the oxide film 221 is anisotropically etched, whereby the impurity region 215b of the main surface of the semiconductor substrate 200 is partially exposed. Impurity As is injected into the main surface of the semiconductor substrate 200 exposed by this self-aligned opening using the oxide film 221 as a mask. Consequently, an n⁺ type impurity region 217b is formed in a self-alignment manner in a part of the impurity region 215b (as shown in FIG. 12F).

Figure 12G:
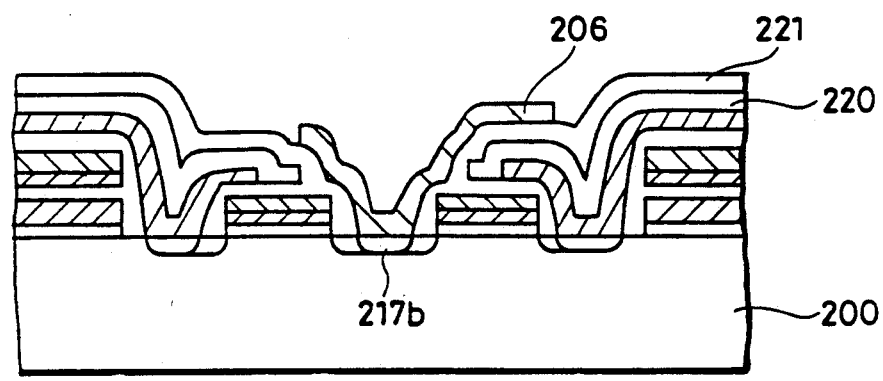

A polysilicon layer 206 is formed to cover the exposed main surface of the semiconductor substrate 200 and it is patterned in a prescribed form. The patterned polysilicon layer 206 corresponds to the polypad in FIG. 9 (as shown in FIG. 12G).

Figure 12H:
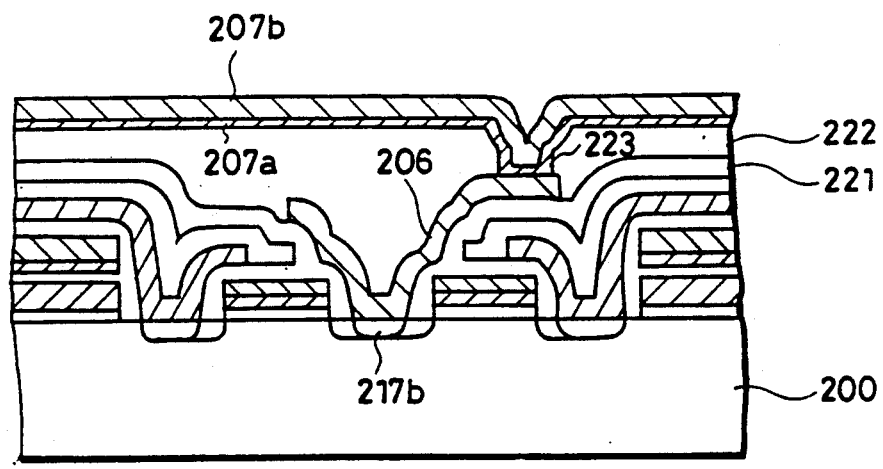
Figure 13:
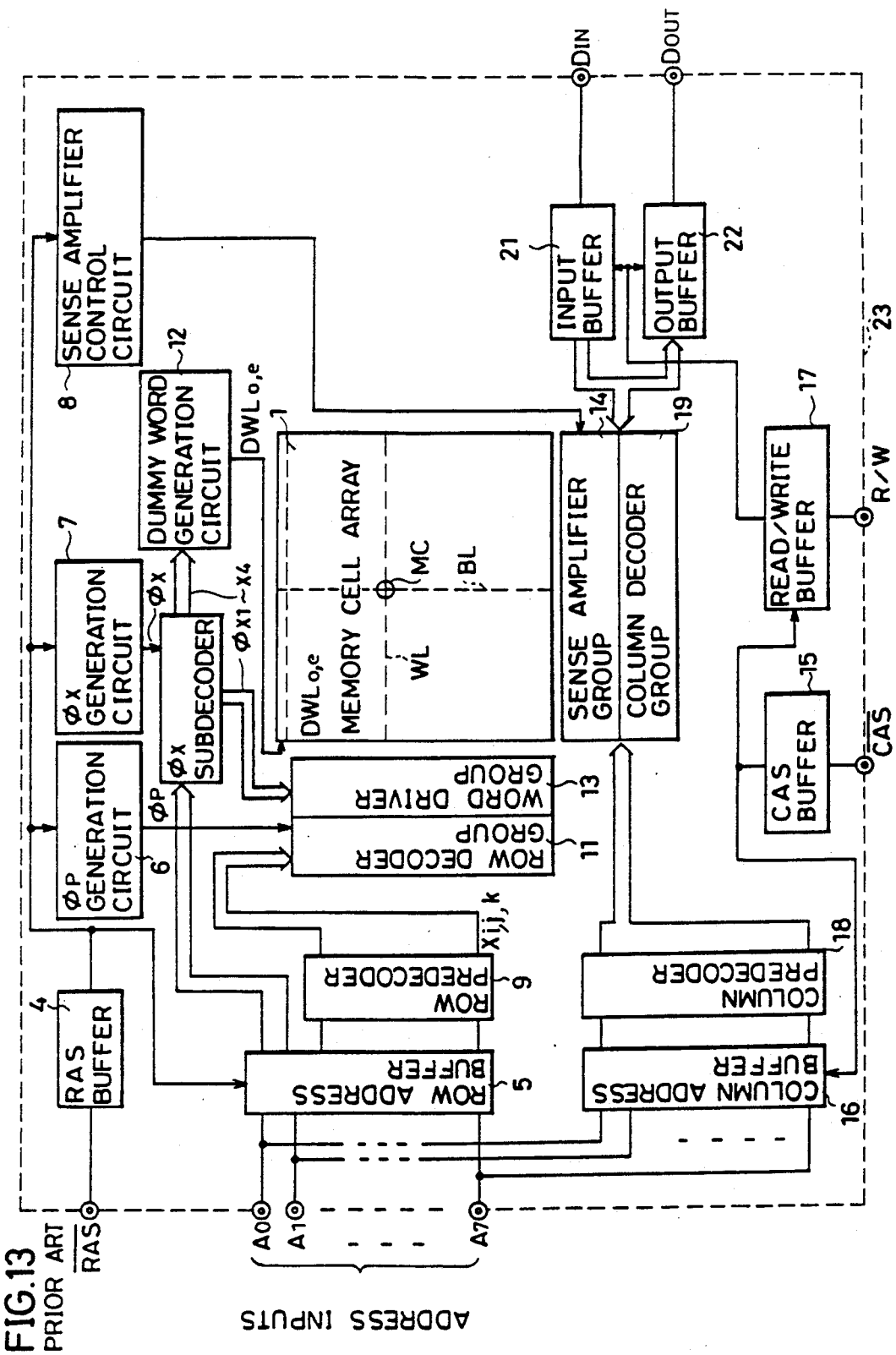
FIG. 13 is a block diagram showing a structure of a conventional dynamic semiconductor memory device.

Finally, an oxide film 222 as an interlayer insulating film is formed over the whole surface of the oxide film 221 to cover the polypad 208. A contact hole 223 is provided at a predetermined position of the interlayer insulating film 220 and a polysilicon layer 207a and a tungsten silicide film 207b are formed successively on the oxide film 220 to fill the contact hole 223. The conductor layers of the polysilicon 207a and the tungsten silicide 207b are patterned in a prescribed form, so that a bit line 207 is formed (as shown in FIG. 12H).

Thus, the polypad structure shown in FIG. 9 is formed. Needless to say, the polypad structure in the twisted portions of the bit lines shown in FIGS. 10 and 11 are formed in the same manner by this manufacturing method.

In the above described embodiment, the structure using polypads at twisted portions of the bit lines is applied to the bit line pairs of the dummy reversal system. However, this structure is also applicable to the bit lines not using the dummy reversal system and, needless to say, the integration scale can be enhanced also in such a case.

The semiconductor memory device according to the present invention comprises bit lines constituting pairs, the respective bit lines of each pair intersecting, and four dummy word lines intersecting with those bit lines, the dummy word lines being arranged at the twisted portions of the bit lines. Consequently, noise due to capacitance coupling is equal in each bit line pair and such noise is superimposed on each other. In addition, dummy cells regularly corresponding to the selected memory cells are obtained for all the bit line pairs. Since dummy word lines are arranged at the twisted portions of the bit line pairs and part of the output of the word drivers are caused to intersect, to be connected to the word lines, the logic of selection of dummy word lines can be remarkably simplified. In addition, since the polypad structure is adopted in the twisted intersection portions of the bit lines, such structure is advantageous in enhancement of the integration scale without requiring increase in the areas occupied by the intersection portions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in a matrix of rows and columns for storing information charge;
   a plurality of bit line pairs, each comprising a pair of bit lines having at least one twisted portion, the respective bit lines being provided corresponding to the rows of said memory cells and connected to the memory cells of the corresponding rows;
   a plurality of word lines provided corresponding to the columns of said memory cells in a direction intersecting with said bit line pairs, and connected to the memory cells of the corresponding columns;
   read means for selecting any of said word lines by applying a potential thereto, and reading the respective information charges of the memory cells connected to the selected word line onto one of the bit lines of each said bit line pair;
   a plurality of sense amplifiers provided corresponding to the respective bit line pairs, each said sense amplifier detecting a potential difference appearing between the bit lines of each said bit line pair when said read means reads the information charges of the memory cells; and
   potential applying means for applying a potential for compensating for change in a potential of the bit lines to said bit lines, said change being caused by rise of a potential of the word line selected by said read means, wherein said potential applying means comprises
   (i) a plurality of dummy cells each connected to the corresponding bit line, at least one dummy cell being provided for each bit line,
   (ii) a plurality of dummy word lines provided corresponding to the respective dummy cells in a direction intersecting with said bit line pairs and connected to the corresponding dummy cells, a predetermined potential being applied thereto, and
   (iii) potential removing means responsive to the selection of the word line by said read means, for removing said predetermined potential applied to the dummy word line connected to any of the dummy cells provided corresponding to the bit lines to which the memory cells connected to the selected word line are connected.

2. A semiconductor memory device in accordance with claim 1, wherein
   each said memory cell comprises a transistor connected through a connection portion to the corresponding bit line, and the potential change appearing on the bit lines when the word line is selected by said read means is caused by a capacitance coupling between the word line to which the potential is applied and said connection portion of said transistor included in the memory cells from which reading is effected.

3. A semiconductor memory device in accordance with claim 1, wherein
   each said bit line pair has two twisted portions for each said bit line, and
   each of said dummy cells includes a transistor connected through a connection portion to the corresponding bit line.

4. A semiconductor memory device in accordance with claim 3, wherein
   a potential change in each bit line caused by capacitance coupling between any of the word lines to which said predetermined potential is applied and said connection portion of second transistor is equal to a potential change appearing between the respective bit lines when the word line is selected by said read means.

5. A semiconductor memory device in accordance with claim 4, wherein
   two or more dummy word lines included in said dummy word lines are provided for a twisted portion of a predetermined bit line pair out of said bit line pairs.

6. A semiconductor memory device in accordance with claim 5, further comprising
   a plurality of word driver circuits provided corresponding to the respective word lines, wherein
   said word lines are divided into a plurality of word line groups according to the positions of the twisted portions of said bit line pairs and said word driver circuits are divided into a plurality of word driver circuit groups corresponding to said word line groups, to drive the corresponding word lines.

7. A semiconductor memory device in accordance with claim 5, further comprising
   a plurality of word driver circuits provided corresponding to the respective word lines, wherein
   said word lines are divided into four word line groups according to positions of the twisted portions of said bit line pairs and said word driver circuits are divided into four word driver circuit groups corresponding to said word line groups, the word driver circuits of the two word driver circuit groups out of said four word driver circuit groups drive the corresponding word lines, and the word driver circuits of the other two word driver circuit groups drive the word lines adjacent to the corresponding word lines.

8. A semiconductor memory device in accordance with claim 1, wherein
   the number of twisted portions of said bit line pairs is two for each said bit line pair,
   each of said dummy cells includes a transistor connected through a connection portion to the corresponding bit line, and
   two of said dummy word lines are provided at a twisted portion of a predetermined bit line pair out of said bit line pairs, a dummy word line connected with a dummy cell corresponding to one bit line of the bit line pair and a dummy word line connected to a dummy cell corresponding to the other bit line of the bit line pair existing at different twisted portions of said bit line pair.

9. A semiconductor memory device in accordance with claim 8, wherein
   the respective bit lines of the adjacent first and second bit line pairs correspond to one and the other bit lines, one of the first dummy word lines provided at one of the twisted portions of said first bit line pair is connected to the dummy cell provided at said one bit line of said first bit line pair, the other line of said first dummy word line is connected to the dummy cell provided at the other bit line of said second bit line pair, the other one of the second dummy word line provided at the other twisted portion of said first bit line pair is connected to the dummy cell provided at said other bit line of said first bit line pair, the other one of said second dummy word line is connected to the dummy cell provided at said one bit line of said second bit line pair, said potential removing means is responsive to the selection of the word line by said read means and removes simultaneously said predetermined potential applied to said one of said first dummy word lines and said other of said second word lines, or to said other of said first dummy word lines and said one of said second dummy word lines.

10. A semiconductor memory device in accordance with claim 9, further comprising a plurality of word driver circuits provided corresponding to the respective word lines, wherein said word lines are divided into four word line groups according to positions of twisted portions of the bit lines, said word driver circuits are divided into four word driver circuit groups corresponding to said word line groups, the word driver circuits of two word driver circuit groups out of said four word driver circuit groups drive the corresponding word lines and the word driver circuits of the other two word driver circuit groups drive the word lines adjacent to the corresponding word lines.

11. A semiconductor memory device in accordance with claim 1, further comprising a semiconductor substrate having a main surface, on which said memory cells and said word lines are formed, an insulating film covering said memory cells formed on said semiconductor substrate, each said bit line pair being formed on said insulating film and one bit line of said pair being connected through a conductor having a section formed like the letter V at said twisted portion.

12. A semiconductor memory device in accordance with claim 11, wherein part of said word lines are formed on the main surface of said semiconductor substrate through the insulating film, said conductor is polysilicon formed on an upper portion of the memory cells close thereto from above the main surface of said semiconductor substrate in a region between two word lines out of the word lines formed on the main surface of said semiconductor substrate, and one bit line of said pair is connected to said polysilicon in said upper portion.

* * * * *

UNITED STATES PATENT AND TRADEMARK OFFICE
CERTIFICATE OF CORRECTION

PATENT NO. : 5,088,064
DATED : February 11, 1992
INVENTOR(S) : Yoshio MATSUDA et al.

It is certified that error appears in the above-identified patent and that said Letters Patent is hereby corrected as shown below:

On the title page, please delete the current entry [75] and replace with the following:

--[75] Inventors: Yoshio Matsuda, Kazuyasu Fujishima, Tsukasa Ooishi, Kazutami Arimoto, Masaki Tsukude all of Itami-Shi, Japan--

Signed and Sealed this

Thirty-first Day of August, 1993

Attest:

BRUCE LEHMAN

Attesting Officer

Commissioner of Patents and Trademarks